(12) United States Patent
Hashimoto

(10) Patent No.: US 8,457,452 B2
(45) Date of Patent: Jun. 4, 2013

(54) INTEGRATED SEMICONDUCTOR OPTICAL DEVICE

(75) Inventor: Jun-ichi Hashimoto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 169 days.

(21) Appl. No.: 12/906,469

(22) Filed: Oct. 18, 2010

(65) Prior Publication Data

US 2011/0091147 A1 Apr. 21, 2011

(30) Foreign Application Priority Data

Oct. 21, 2009 (JP) ................................. 2009-242721

(51) Int. Cl.
*G02B 6/12* (2006.01)
*G02F 1/35* (2006.01)

(52) U.S. Cl.
USPC ........................................... 385/14; 359/332

(58) Field of Classification Search
USPC ............................................ 359/332; 385/14
See application file for complete search history.

(56) References Cited

U.S. PATENT DOCUMENTS 5,237,639 A * 8/1993 Kato et al. .................... 385/131
6,430,204 B1 * 8/2002 Tanaka ........................ 372/46.01

FOREIGN PATENT DOCUMENTS

JP 2008-66318 3/2008

* cited by examiner

*Primary Examiner* — Charlie Peng
(74) *Attorney, Agent, or Firm* — Smith, Gambrell & Russell, LLP

(57) ABSTRACT

An integrated semiconductor optical device includes first and second semiconductor optical devices. The first semiconductor optical device includes a first core layer, a first upper cladding layer including a first ridge portion, a first buried layer surrounding the first ridge portion, and a first adjusting layer provided between the first buried layer and the first ridge portion. The second semiconductor optical device includes a second core layer, a second upper cladding layer including a second ridge portion. The first semiconductor optical device and the second semiconductor optical device are arranged next to each other in a predetermined axis direction. The first core layer is joined to the second core layer by a butt joint method at a joint boundary between the first and second semiconductor optical devices. The first adjusting layer has a refractive index lower than a refractive index of the first core layer and higher than a refractive index of the first buried layer. The first adjusting layer extends in the predetermined axis direction. The first adjusting layer has a constant width from one end facet to the joint boundary.

19 Claims, 18 Drawing Sheets

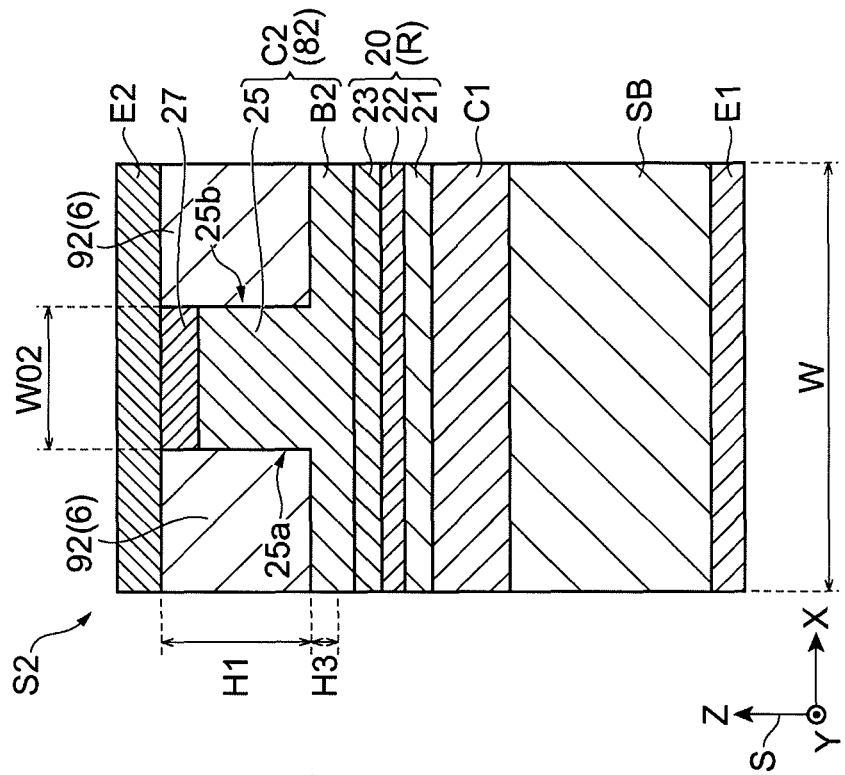
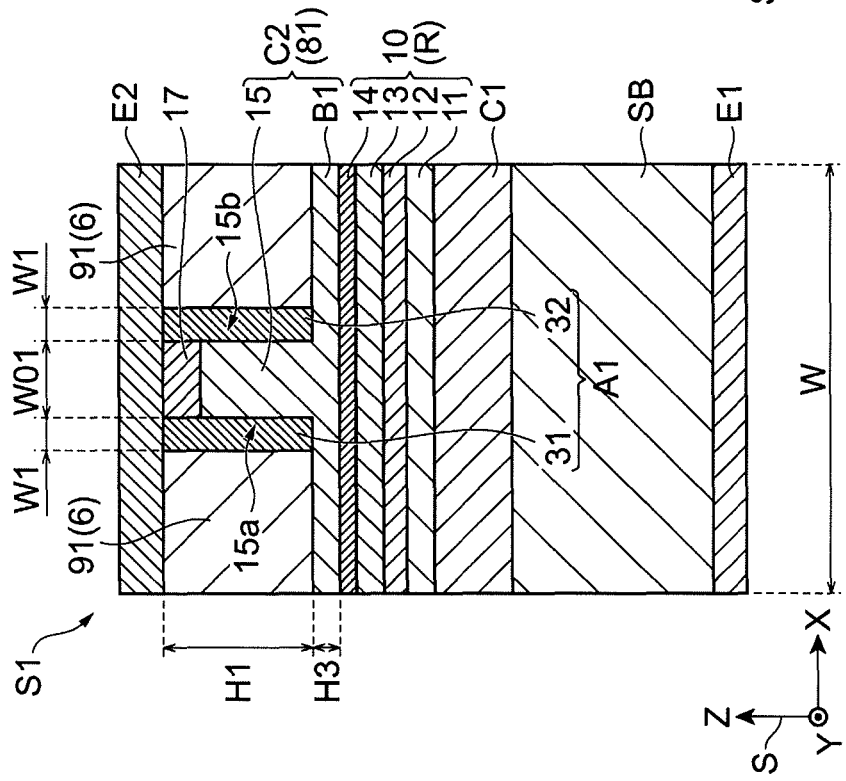
FIG. 2A
FIG. 2B

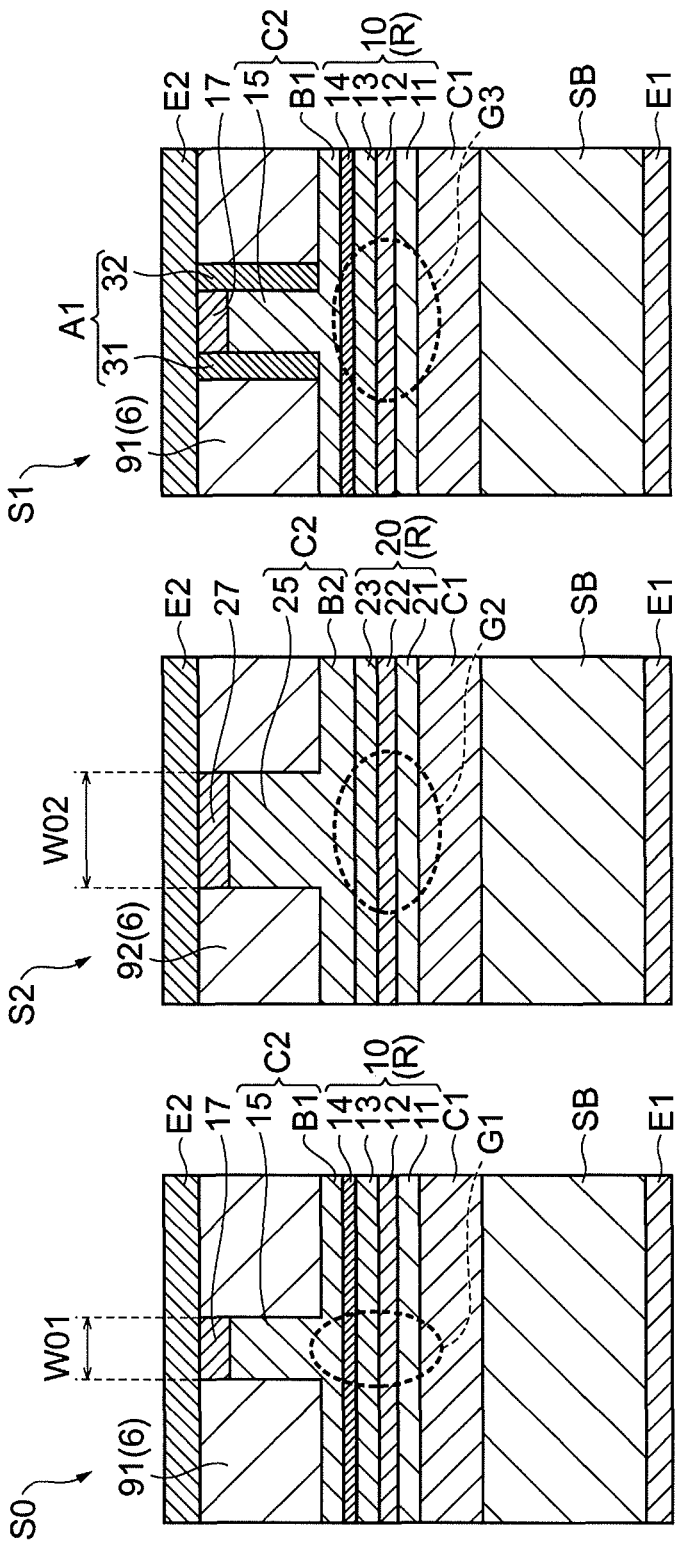

FIG.7

Table I:
Layer structures of the first semiconductor optical device S0 and effective refractive index

| Layer | Structures | Refractive Index, n |
| --- | --- | --- |
| contact layer 17 | p-type $Ga_{0.467}In_{0.533}As$ | |
| second cladding layer C2 | p-type InP<br>t:3 μm | n:3.207 |
| grating layer 14 | p-type $Ga_{0.054}In_{0.946}As_{0.116}P_{0.884}$<br>(average composition)<br>t:0.0234 μm | n:3.254 |
| first upper optical confinement layer 13 | $Ga_{0.136}In_{0.864}As_{0.289}P_{0.711}$<br>t:0.0531 μm | n:3.324 |
| active layer 12 | $Ga_{0.208}In_{0.792}As_{0.453}P_{0.547}$<br>t:0.122 μm | n:3.401 |
| first lower optical confinement layer 11 | $Ga_{0.136}In_{0.864}As_{0.289}P_{0.711}$<br>t:0.0565 μm | n:3.324 |
| first cladding layer C1 | n-type InP<br>t:3 μm | n:3.207 |
| buried layer 6 | BCB resin | n:1.5 |
| width W01 of first ridge portion 15 | W01:1.1 μm | |
| effective refractive index N | | N:3.232 |

FIG.8

Table II:
Layer structures of the second semiconductor optical device S2 and effective refractive index

| Layer | Structures | Refractive Index, n |
| --- | --- | --- |
| contact layer 27 | p-type $Ga_{0.467}In_{0.533}As$ | |
| second cladding layer C2 | p-type InP<br>t:3 μm | n:3.207 |
| second upper optical confinement layer 23 | $Ga_{0.136}In_{0.864}As_{0.289}P_{0.711}$<br>t:0.057 μm | n:3.324 |
| optical absorption layer 22 | $Ga_{0.233}In_{0.767}As_{0.507}P_{0.493}$<br>t:0.124 μm | n:3.431 |
| second lower optical confinement layer 21 | $Ga_{0.136}In_{0.864}As_{0.289}P_{0.711}$<br>t:0.057 μm | n:3.324 |
| first cladding layer C1 | n-type InP<br>t:3 μm | n:3.207 |
| buried layer 6 | BCB resin | n:1.5 |
| width W02 of second ridge portion 25 | W02:1.16 μm | |
| effective refractive index N | | N:3.240 |

FIG. 9

Table III:
Layer structures of the first semiconductor optical device S1 and effective refractive index

| Layer | Structures | Refractive Index, n |
|---|---|---|
| contact layer 17 | p-type $Ga_{0.467}In_{0.533}As$ | |
| second cladding layer C2 | p-type InP<br>t: 3 μm | n: 3.207 |
| grating layer 14 | p-type $Ga_{0.054}In_{0.946}As_{0.116}P_{0.884}$<br>(average composition)<br>t: 0.0234 μm | n: 3.254 |
| first upper optical confinement layer 13 | $Ga_{0.136}In_{0.864}As_{0.289}P_{0.711}$<br>t: 0.0531 μm | n: 3.324 |
| active layer 12 | $Ga_{0.208}In_{0.792}As_{0.453}P_{0.547}$<br>t: 0.122 μm | n: 3.401 |
| first lower optical confinement layer 11 | $Ga_{0.136}In_{0.864}As_{0.289}P_{0.711}$<br>t: 0.0565 μm | n: 3.324 |
| first cladding layer C1 | n-type InP<br>t: 3 μm | n: 3.207 |
| buried layer 6 | BCB resin | n: 1.5 |
| first adjusting layer A1 | Fe-doped InP<br>W: 0.2 μm | n: 3.207 |
| width W01 of first ridge portion 15 | W01: 1.1 μm | |
| effective refractive index N | | N: 3.240 |

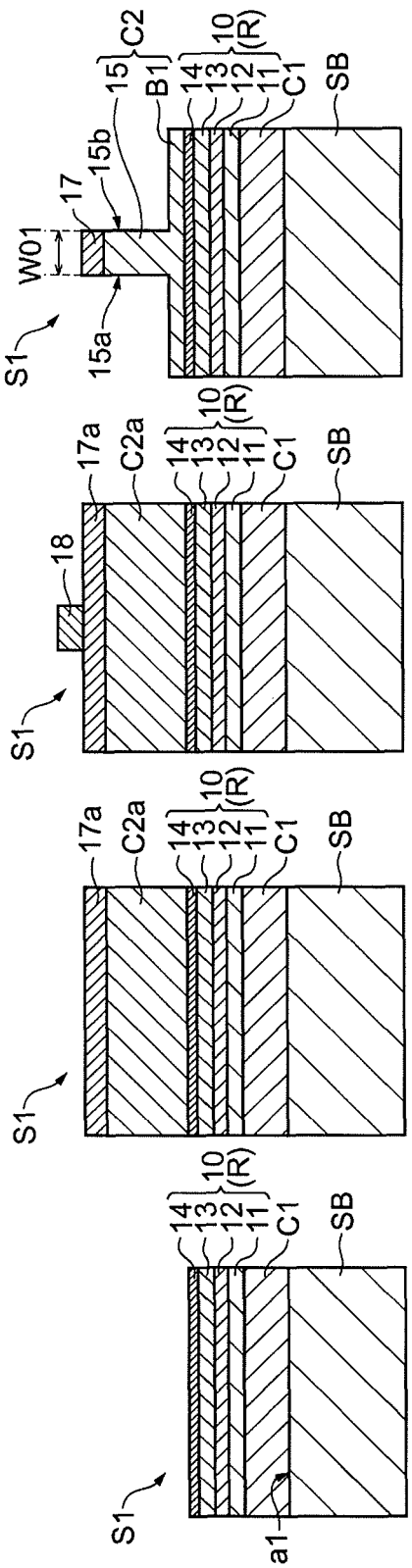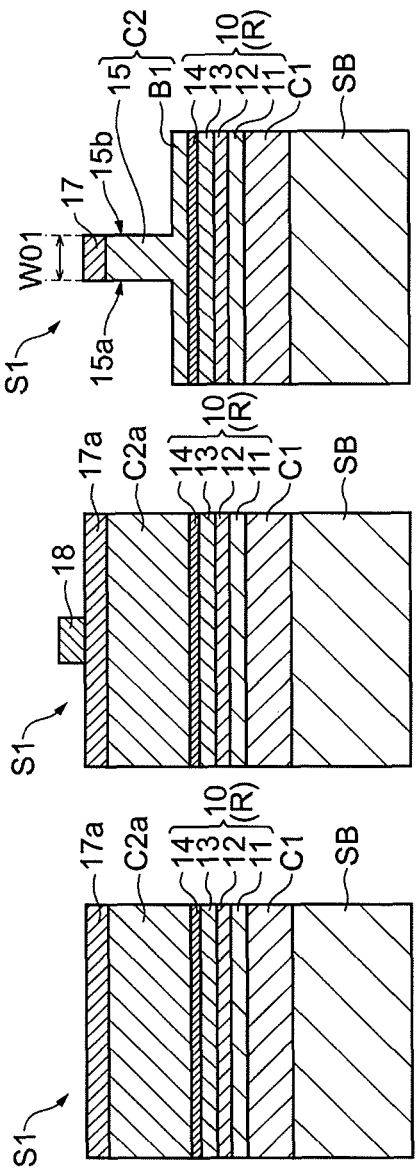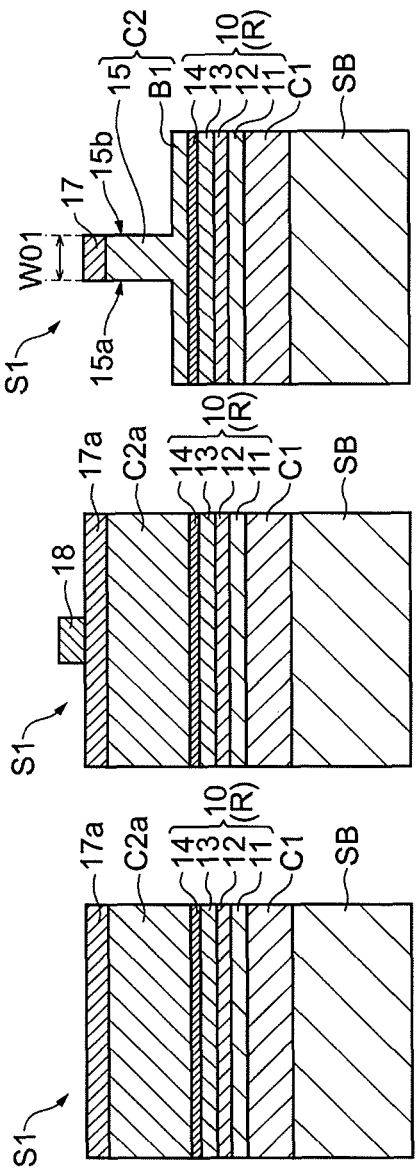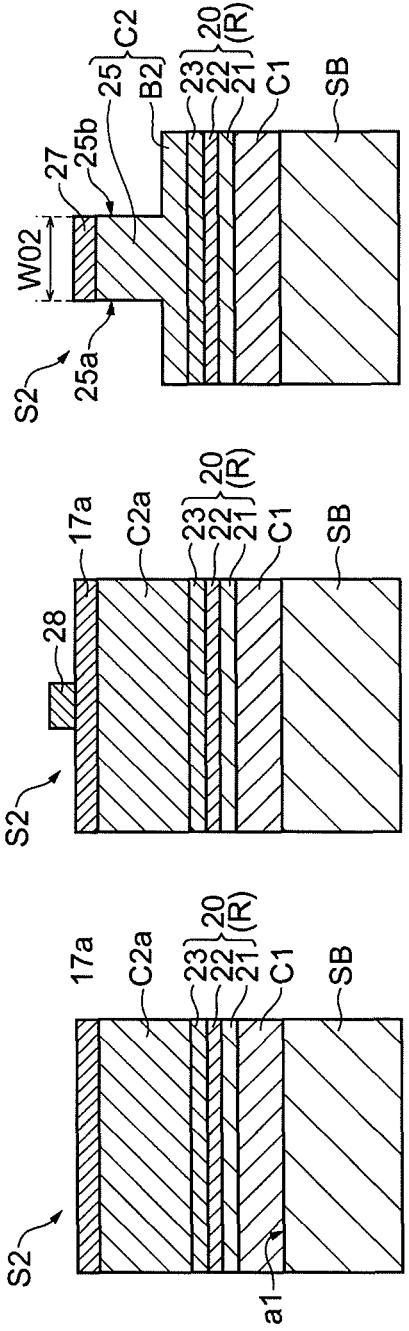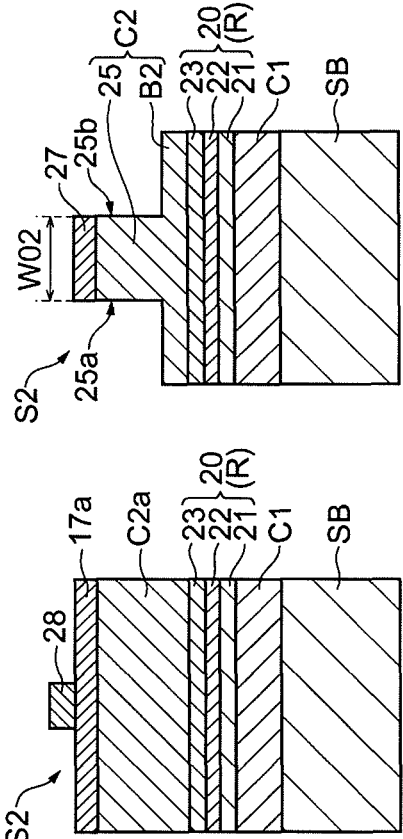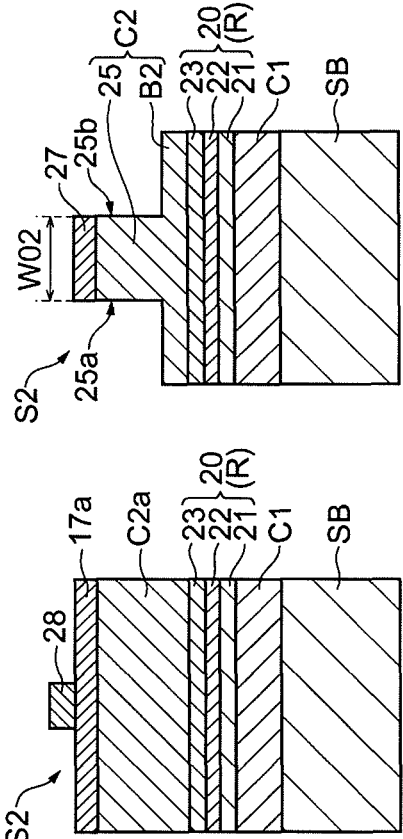

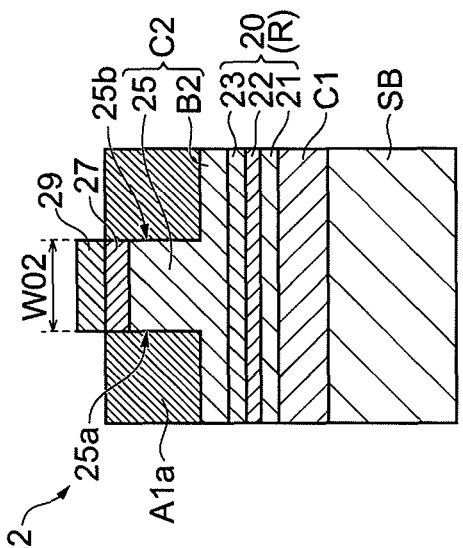
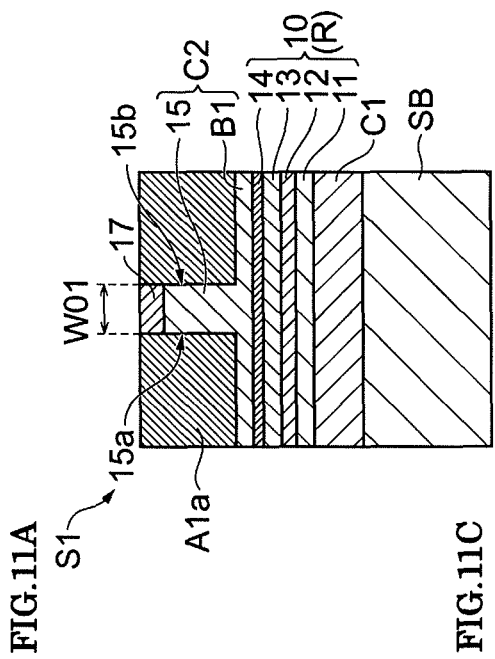
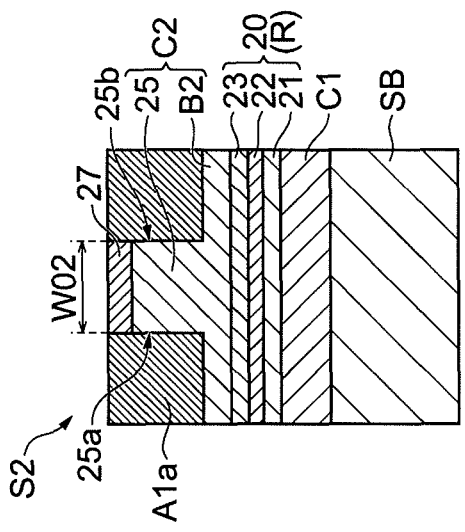

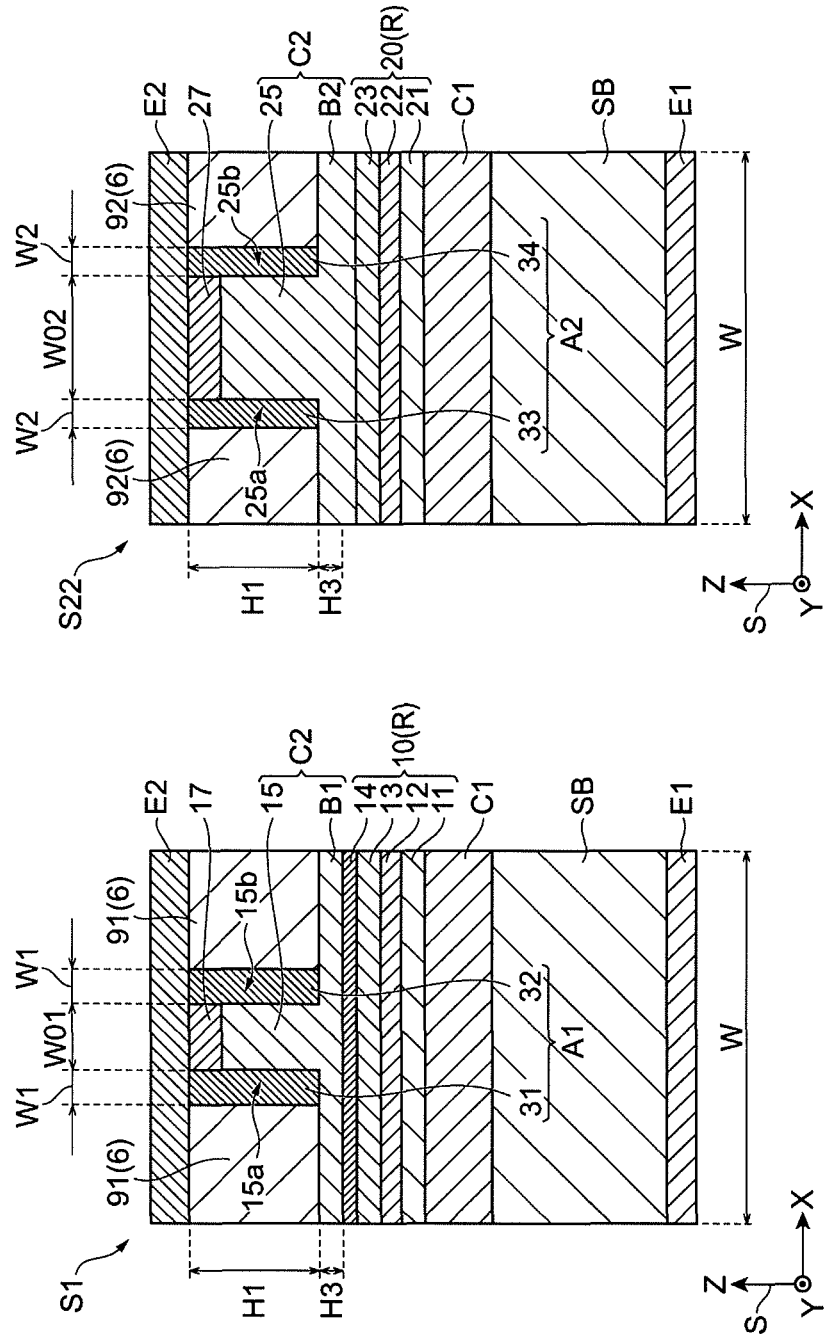

INTEGRATED SEMICONDUCTOR OPTICAL DEVICE

BACKGROUND OF THE INVENTION

1. Field of the Invention

The present invention relates to an integrated semiconductor optical device used for optical communication, optical recording, optical measurement, or the like.

2. Description of the Related Art

In recent years, an integrated semiconductor optical device in which a gain region (light emitting region) or a semiconductor laser device and another semiconductor optical device such as an optical modulator, an optical amplifier, or an optical multiplexer and demultiplexer are integrated on a single semiconductor substrate has been developed. To couple a semiconductor laser device with another semiconductor optical device optically, for example, a butt joint method is employed. Japanese Unexamined Patent Application Publication No. 2008-66318 (Patent Document 1) describes a semiconductor wavelength tunable laser in which a gain region and a ring resonator have been joined together by a butt joint method. In this semiconductor wavelength tunable laser, the gain region and the ring resonator have mesa-type optical waveguide structures that are composed of different materials and have different mesa structures, respectively.

SUMMARY OF THE INVENTION

In a semiconductor optical device having an optical waveguide structure, the beam profile of guided light propagating through the optical waveguide varies in accordance with, for example, the structure of the optical waveguide or materials constituting the optical waveguide. Accordingly, when a plurality of semiconductor optical devices having optical waveguides that have different structures or are composed of different materials are joined together by a butt joint method, coupling loss of guided light is caused by reflection at the joint boundary of the semiconductor optical devices.

In Patent Document 1, a semiconductor mesa structure is employed as the structures of the optical waveguides. The semiconductor mesa structure includes a first cladding layer, a core layer (or an active layer), and a second cladding layer. The side surfaces of the semiconductor mesa structure are surrounded by a semiconductor material or a polyimide resin. Specifically, in Patent Document 1, one semiconductor optical device (gain region) and another semiconductor optical device (ring resonator) have been joined together by a butt joint method and the mesa width of the one semiconductor optical device is equal to the mesa width of the other semiconductor optical device. The mesa structure of the one semiconductor optical device is buried with a semi-insulating semiconductor material and the disposed semi-insulating semiconductor material is further buried with a polyimide resin. In contrast, the mesa structure of the other semiconductor optical device (ring resonator) is buried only with a polyimide resin. Thus, the mesa structures of these two semiconductor optical devices are buried in different configurations. As a result, the mode profile of guided light propagating through the optical waveguide of the one semiconductor optical device is different from the mode profile of guided light propagating through the optical waveguide of the other semiconductor optical device. To reduce coupling loss, in Patent Document 1, a tapering region is provided between the gain region and the ring resonator. The tapering region gradually and continuously makes the mode profile in the one semiconductor optical device be close to the mode profile in the other semiconductor optical device. However, the addition of the tapering region results in an increase in the device length. Furthermore, the addition of the tapering region requires an extra process, which complicates the processing process. Accordingly, in the integrated semiconductor optical device described in Patent Document 1, it is difficult to achieve a decrease in the size of the device and a decrease in the cost.

An integrated semiconductor optical device according to the present invention includes a semiconductor substrate; a first end facet and second end facet opposite to the first end facet; a first semiconductor optical device; and a second semiconductor optical device. The first semiconductor optical device includes a first lower cladding layer provided on the semiconductor substrate, a first upper cladding layer including a first ridge portion, a first core layer provided between the first lower cladding layer and the first upper cladding layer, a first buried layer surrounding the first ridge portion, and a first adjusting layer provided between the first buried layer and the first ridge portion. The second semiconductor optical device includes a second lower cladding layer provided on the semiconductor substrate, a second upper cladding layer including a second ridge portion, and a second core layer provided between the second lower cladding layer and the second upper cladding layer. The first semiconductor optical device and the second semiconductor optical device are arranged next to each other in a direction of the predetermined axis. The first core layer is joined to the second core layer by a butt joint method at a joint boundary between the first semiconductor optical device and the second semiconductor optical device. The first adjusting layer has a refractive index lower than a refractive index of the first core layer and higher than a refractive index of the first buried layer. The first adjusting layer extends in the direction of the predetermined axis. The first adjusting layer has a constant width from the first end facet to the joint boundary.

In the integrated semiconductor optical device according to the present invention, preferably the first ridge portion may have a width different from a width of the second ridge portion. The first adjusting layer may be in contact with the first ridge portion. Furthermore, the first upper cladding layer, the first core layer, the second upper cladding layer, and the second core layer may contain semiconductor materials. The first buried layer may contain an insulating material.

In the integrated semiconductor optical device according to the present invention, the first semiconductor optical device preferably includes a first optical waveguide including the first lower cladding layer, the first core layer, and the first upper cladding layer. The second semiconductor optical device includes a second optical waveguide including the second lower cladding layer, the second core layer, and the second upper cladding layer. An effective refractive index of the first optical waveguide is substantially equal to an effective refractive index of the second optical waveguide.

In the integrated semiconductor optical device according to the present invention, in the first semiconductor optical device, light propagates through the first optical waveguide including the first lower cladding layer, the first core layer, and the first upper cladding layer. In the second semiconductor optical device, light propagates through the second optical waveguide including the second lower cladding layer, the second core layer, and the second upper cladding layer. The first adjusting layer has a refractive index between the refractive index of the first core layer and the refractive index of the first buried layer. The first adjusting layer extends in the direction of the predetermined axis. The first adjusting layer is in contact with the first ridge portion. The first adjusting layer may be formed so as to have a width that is constant from the first end facet to the joint boundary. By adding the first adjusting layer so as to be next to the first ridge portion in the first semiconductor optical device, the optical confinement of guided light in a direction (hereafter, also referred to as a first direction) orthogonal to the direction in which the first lower cladding layer, the first core layer, and the first upper cladding layer are stacked and the direction of the predetermined axis is reduced. As a result, the beam profile of guided light in the first semiconductor optical device is broadened in the first direction. In contrast, the beam profile of guided light in the first semiconductor optical device in a direction (hereafter, also referred to as a second direction) orthogonal to the direction of the predetermined axis and parallel to the direction in which the first lower cladding layer, the first core layer, and the first upper cladding layer are stacked is conversely narrowed due to the broadened profile in the first direction. Thus, the beam profile in the first semiconductor optical device is made close to the beam profile in the second semiconductor optical device. As a result, the difference between the beam profile of guided light in the first semiconductor optical device and the beam profile of guided light in the second semiconductor optical device can be reduced. Adjustment can be performed such that the effective refractive index of the first optical waveguide and the effective refractive index of the second optical waveguide are substantially equal to each other. Accordingly, scattering or reflection of guided light at the butt-joint joint interface between the first semiconductor optical device and the second semiconductor optical device can be reduced. Thus, coupling loss of guided light can be suppressed without a tapering region.

In the integrated semiconductor optical device according to the present invention, the first adjusting layer preferably contains a material selected from titanium oxide, tantalum oxide, zirconium oxide, and amorphous silicon. Such a material has a refractive index between the refractive index of the first core layer and the refractive index of the first buried layer. Accordingly, the difference between the beam profile of guided light in the first semiconductor optical device and the beam profile of guided light in the second semiconductor optical device is reduced by using those materials for the first adjusting layer.

In the integrated semiconductor optical device according to the present invention, the first adjusting layer preferably contains a semiconductor material selected from InP, GaInAsP, GaInAs, AlGaInAs, and AlInAs. Such a semiconductor material can have a refractive index between the refractive index of the first core layer and the refractive index of the first buried layer. Accordingly, the difference between the beam profile of guided light in the first semiconductor optical device and the beam profile of guided light in the second semiconductor optical device is reduced by using those semiconductor materials for the first adjusting layer.

In the integrated semiconductor optical device according to the present invention, the first buried layer preferably contains a polyimide resin or a benzocyclobutene (BCB) resin. Polyimide resins and BCB resins have high resistance. Polyimide resins and BCB resins have the function of blocking current. Accordingly, a polyimide resin or a BCB resin is a suitable material for forming the buried layer.

In the integrated semiconductor optical device according to the present invention, preferably the second semiconductor optical device further includes a second buried layer surrounding the second ridge portion, and a second adjusting layer provided between the second buried layer and the second ridge portion. The second adjusting layer extends in the direction of the predetermined axis. The second adjusting layer has a refractive index lower than a refractive index of the second core layer and higher than the refractive index of the second buried layer. Furthermore, the second adjusting layer preferably has a constant width from the second end facet to the joint boundary. The second adjusting layer is preferably in contact with the second ridge portion.

In this integrated semiconductor optical device, the second adjusting layer extends in the direction of the predetermined axis. The second adjusting layer is in contact with the second ridge portion. The second adjusting layer has a refractive index between the refractive index of the second core layer and the refractive index of the second buried layer. By adding the second adjusting layer so as to be next to the second ridge portion in the second semiconductor optical device, the ratio of the beam width in the first direction to the beam width in the second direction in the second optical waveguide can be adjusted. Accordingly, by using not only the first adjusting layer but also the second adjusting layer and without a tapering region, the difference between the beam profile of guided light in the first semiconductor optical device and the beam profile of guided light in the second semiconductor optical device can be reduced. Thus, the degree of freedom in designing for reducing the difference in beam profile is enhanced.

In the integrated semiconductor optical device according to the present invention, preferably the first semiconductor optical device further includes a third adjusting layer sandwiched between the first adjusting layer and the first buried layer, and the third adjusting layer has a refractive index lower than the refractive index of the first adjusting layer and higher than the refractive index of the first buried layer. Furthermore, the third adjusting layer has a constant width from the first end facet to the joint boundary.

In this integrated semiconductor optical device, the third adjusting layer is sandwiched between the first adjusting layer and the first buried layer. Accordingly, the third adjusting layer can also be used to reduce the difference between the beam profile of guided light in the first semiconductor optical device and the beam profile of guided light in the second semiconductor optical device. Thus, the degree of freedom in designing for reducing the difference in beam profile is further enhanced.

In the integrated semiconductor optical device according to the present invention, preferably the second semiconductor optical device further includes a second buried layer surrounding the second ridge portion, a second adjusting layer provided between the second buried layer and the second ridge portion, and a fourth adjusting layer provided between the second adjusting layer and the second buried layer. The second adjusting layer extends in the direction of the predetermined axis. The second adjusting layer is in contact with the second ridge portion. The second adjusting layer has a refractive index lower than a refractive index of the second core layer and higher than the refractive index of the second buried layer. The fourth adjusting layer has a refractive index lower than the refractive index of the second adjusting layer and higher than the refractive index of the second buried layer. Furthermore, the second adjusting layer and the fourth adjusting layer have constant widths from the second end facet to the joint boundary.

In this integrated semiconductor optical device, the fourth adjusting layer is sandwiched between the second adjusting layer and the second buried layer. Accordingly, the fourth adjusting layer can also be used to reduce the difference between the beam profile of guided light in the first semiconductor optical device and the beam profile of guided light in the second semiconductor optical device. Thus, the degree of freedom in designing for reducing the difference in beam profile is further enhanced.

In the integrated semiconductor optical device according to the present invention, preferably the first semiconductor optical device may be a light emitting device, and the second semiconductor optical device may be an electro-absorption optical modulator.

In this integrated semiconductor optical device, since the first adjusting layer is provided, scattering or reflection of guided light at the butt-joint joint interface between the first semiconductor optical device and the second semiconductor optical device can be reduced. Thus, coupling loss of guided light can be suppressed without a tapering region. Therefore, degradation of device characteristics such as degradation of the beam profile of guided light and a decrease in the output of emitted light can be suppressed.

BRIEF DESCRIPTION OF THE DRAWINGS

FIG. 2A is a sectional view taken along line IIA-IIA in FIG. 1. FIG. 2B is a sectional view taken along line IIB-IIB in FIG. 1.

FIGS. 4A, 4B, and 4C illustrate examples of a beam intensity distribution of guided light.

FIG. 7 is a Table I illustrating an example of the parameters used for calculating the effective refractive index N of the first semiconductor optical device S0 illustrated in FIG. 5A, and the calculation result of the effective refractive index N.

FIG. 8 is a Table II illustrating an example of the parameters used for calculating the effective refractive index N of the first semiconductor optical device S2 illustrated in FIG. 5B, and the calculation result of the effective refractive index N.

FIG. 9 is a Table III illustrating an example of the parameters used for calculating the effective refractive index N of the first semiconductor optical device S1 illustrated in FIG. 6, and the calculation result of the effective refractive index N.

FIGS. 10A to 10G are schematic views illustrating an example of a method for producing an integrated semiconductor optical device according to the first embodiment.

FIGS. 11A to 11D are schematic views illustrating an example of a method for producing an integrated semiconductor optical device according to the first embodiment.

FIGS. 14A and 14B are sectional views illustrating a modification of the configurations in FIGS. 2A and 2B.

DESCRIPTION OF THE PREFERRED EMBODIMENTS

Hereinafter, embodiments according to the present invention will be described in detail with reference to the attached drawings. In the descriptions of the drawings, like elements are denoted with like element numerals. An XYZ rectangular coordinate system S is illustrated in some of the drawings.

First Embodiment

Figure 1:
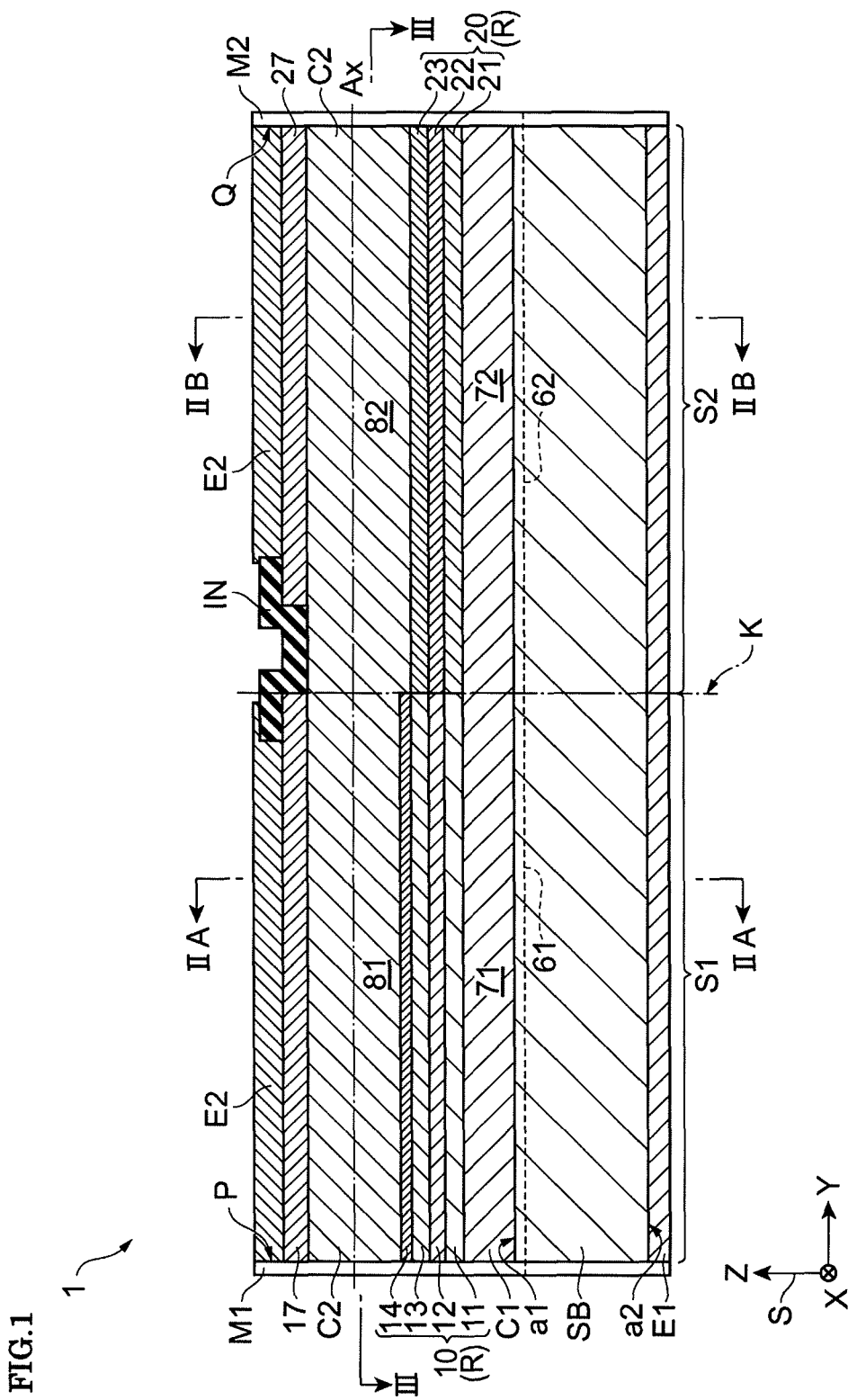
FIG. 1 is a sectional view schematically illustrating an integrated semiconductor optical device according to a first embodiment.
Figure 3:
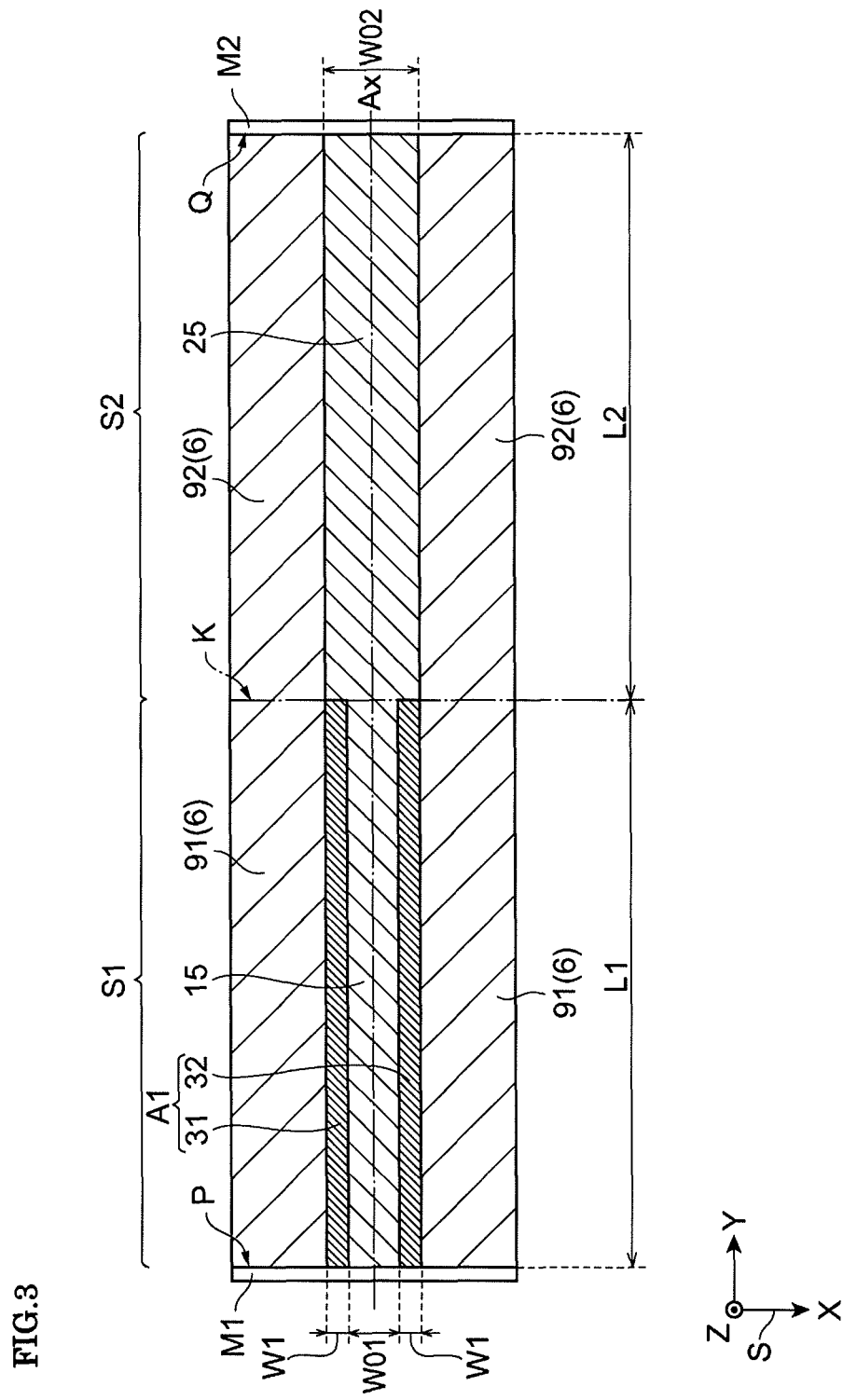
FIG. 3 is a sectional view taken along line in FIG. 1.

FIG. 1 is a sectional view schematically illustrating an integrated semiconductor optical device 1. FIG. 2A is a sectional view taken along line IIA-IIA in FIG. 1. FIG. 2B is a sectional view taken along line IIB-IIB in FIG. 1. FIG. 3 is a sectional view taken along line III-III in FIG. 1.

Referring to FIG. 1, the integrated semiconductor optical device 1 includes a first semiconductor optical device S1 and a second semiconductor optical device S2. The first semiconductor optical device S1 is, for example, a semiconductor light emitting device such as a distributed feedback (DFB) laser diode. The second semiconductor optical device S2 is, for example, an electro-absorption (EA) optical modulator. The first semiconductor optical device S1 and the second semiconductor optical device S2 are optically joined together at a joint boundary K by a butt joint method.

In the integrated semiconductor optical device 1, the first semiconductor optical device S1 and the second semiconductor optical device S2 are provided on a semiconductor substrate SB in the direction of a predetermined axis Ax.

The first semiconductor optical device S1 includes the first lower cladding layer C1 provided on the semiconductor substrate SB, the first core layer 10, the first upper cladding layer C2, a first adjusting layer A1, and a first buried layer 6. Specifically, the first semiconductor optical device S1 includes a first region 71 of the lower cladding layer C1, the first core layer 10, and a first region 81 of the upper cladding layer C2, the first adjusting layer A1, and a first region 91 of the buried layer 6. In this embodiment, the first region 71 of the lower cladding layer C1 is composed of the first lower cladding layer, and the first region 81 of the upper cladding layer C2 is composed of the first upper cladding layer.

The second semiconductor optical device S2 includes the second lower cladding layer C1 provided on the semiconductor substrate SB, the second core layer 20, and the second upper cladding layer C2. Specifically, the second semiconductor optical device S2 includes a second region 72 of the lower cladding layer C1, the second core layer 20, a second region 82 of the upper cladding layer C2, and a second region 92 of the buried layer 6. In the first embodiment, no adjusting layer is formed in the second semiconductor optical device S2. The second region 72 of the lower cladding layer C1 is composed of the second lower cladding layer, and the second region 82 of the upper cladding layer C2 is composed of the second upper cladding layer. The first lower cladding layer and the second lower cladding layer may be composed of the same material as the lower cladding layer C1. The first upper cladding layer and the second upper cladding layer may be composed of the same material as the upper cladding layer C2.

The semiconductor substrate SB includes a main surface a1 including a first area 61 and a second area 62 that are arranged in the direction of the predetermined axis Ax. The predetermined axis Ax extends in a direction parallel to the Y axis. The main surface a1 of the semiconductor substrate SB extends so as to be parallel to the XY plane. The semiconductor substrate SB also includes a back surface a2, which faces the main surface a1.

The first semiconductor optical device S1 includes a first ridge portion 15 in the first upper cladding layer C2 at the first region 81. The second semiconductor optical device S2 includes a second ridge portion 25 in the second upper cladding layer C2 at the second region 82. The first ridge portion 15 and the second ridge portion 25 are arranged in the direction of the predetermined axis Ax. The first ridge portion 15 has a width W01 smaller than a width W of the first core layer 10. The width W01 of the first ridge portion 15 is constant. The width W01 of the first ridge portion 15 in a direction (the X-axis direction in FIG. 3) orthogonal to the direction of the predetermined axis Ax and parallel to the semiconductor substrate SB is constant. In an example illustrated in FIG. 3, the width W01 of the first ridge portion 15 is constant from one end facet P of the integrated semiconductor optical device 1 to the joint boundary K. The second ridge portion 25 has a width W02 smaller than a width W of the second core layer 20. The width W02 of the second ridge portion 25 is constant. The width W02 of the second ridge portion 25 in a direction (the X-axis direction in FIG. 3) orthogonal to the direction of the predetermined axis Ax and parallel to the semiconductor substrate SB is constant. In the example illustrated in FIG. 3, the width W02 of the second ridge portion 25 is constant from another end facet Q of the integrated semiconductor optical device 1 to the joint boundary K. In the first embodiment, the width W01 of the first ridge portion 15 is different from the width W02 of the second ridge portion 25. However, in another embodiment, the width W01 of the first ridge portion 15 and the width W02 of the second ridge portion 25 may be the same or different from each other. To make the first semiconductor optical device S1 and the second semiconductor optical device S2 have the same effective refractive index, if necessary, the ridge widths W01 and W02 may be appropriately adjusted when the first adjusting layer A1 and a second adjusting layer A2 are used.

The first region 81 of the first upper cladding layer C2 may include, in addition to the first ridge portion 15, a first bottom portion B1. The first bottom portion B1 extends in the direction of the predetermined axis Ax. The width W of the first bottom portion B1 is larger than the width W01 of the first ridge portion 15. The first ridge portion 15 includes a first side surface 15a and a second side surface 15b that extend in the direction of the predetermined axis Ax.

The second region 82 of the second upper cladding layer C2 may include, in addition to the second ridge portion 25, a second bottom portion B2. The second bottom portion B2 extends in the direction of the predetermined axis Ax. The width W of the second bottom portion B2 is larger than the width W02 of the second ridge portion 25. The second ridge portion 25 includes a third side surface 25a and a fourth side surface 25b that extend in the direction of the predetermined axis Ax.

The first core layer 10 is provided between the first region 71 of the first lower cladding layer C1 and the first region 81 of the first upper cladding layer C2. The first core layer 10 is provided so as to be on and in contact with the first region 71 of the first lower cladding layer C1. The first region 81 of the first upper cladding layer C2 is provided so as to be on and in contact with the first core layer 10. The first core layer 10 includes a first lower optical confinement layer 11, an active layer 12, a first upper optical confinement layer 13, and a grating layer 14.

The second core layer 20 is provided between the second region 72 of the second lower cladding layer C1 and the second region 82 of the second upper cladding layer C2. The second core layer 20 is provided so as to be on and in contact with the second region 72 of the second lower cladding layer C1. The second region 82 of the second upper cladding layer C2 is provided so as to be on and in contact with the second core layer 20. The second core layer 20 includes a second lower optical confinement layer 21, an optical absorption layer 22, and a second upper optical confinement layer 23.

The first core layer 10 is joined to the second core layer 20 by a butt joint method. A joint interface is provided at the boundary between the first core layer 10 and the second core layer 20.

The first buried layer includes the first region 91 provided above the first area 61 and the second buried layer includes the second region 92 provided above the second area 62. The first buried layer and the second buried layer may be composed of the same material as the buried layer. In this embodiment, the first buried layer and the second buried layer is denoted as the buried layer 6. The first region 91 and the second region 92 of the buried layer 6 are provided in a continuous form. The first ridge portion 15 is buried by the first region 91 of the buried layer 6. The second ridge portion 25 is buried by the second region 92 of the buried layer 6.

The first adjusting layer A1 extends in the direction of the predetermined axis Ax so as to be in contact with the first ridge portion 15. The first adjusting layer A1 is provided between the first buried layer 6 and the first ridge portion 15. The first adjusting layer A1 includes a first portion 31 and a second portion 32 that extend in the direction of the predetermined axis Ax. The first portion 31 of the first adjusting layer A1 is in contact with the first side surface 15a. The second portion 32 of the first adjusting layer A1 is in contact with the second side surface 15b. Specifically, the first portion 31 of the first adjusting layer A1 is provided between the first region 91 of the first buried layer 6 and the first side surface 15a of the first ridge portion 15. The second portion 32 of the first adjusting layer A1 is provided between the first region 91 of the first buried layer 6 and the second side surface 15b of the first ridge portion 15. In the first embodiment, the first adjusting layer A1 is in contact with the first buried layer 6. The first portion 31 and the second portion 32 of the first adjusting layer A1 are provided so as to be separated from each other. The refractive index of the first adjusting layer A1 is lower than the refractive index of the first core layer 10 and higher than the refractive index of the first region 91 of the first buried layer 6. When the first core layer 10 includes a plurality of semiconductor layers including the active layer 12, the refractive index of the first core layer 10 is represented by the effective refractive index of the first core layer 10. Similarly, when the second core layer 20 includes a plurality of semiconductor layers including the optical absorption layer 22, the refractive index of the second core layer 20 is represented by the effective refractive index of the second core layer 20. The effective refractive index will be described below in detail.

The width (length in the X-axis direction) of the first portion 31 of the first adjusting layer A1 is the same as the width (length in the X-axis direction) of the second portion 32 of the first adjusting layer A1. In FIGS. 2A and 3, the widths of the first portion 31 and the second portion 32 of the first adjusting layer A1 are represented by W1. For example, the widths W1 of the first portion 31 and the second portion 32 can be made 100 nm to 500 nm; a height H1 (length in the Z-axis direction) of the first adjusting layer A1 can be made 1.5 μm to 3.0 μm; and a length L1 (length in the Y-axis direction) of the first adjusting layer A1 can be made 200 μm to 1,000 μm. The widths W1 of the first adjusting layer A1 are constant in a neighboring region of the butt-joint boundary K and the first adjusting layer A1 does not have a tapering shape. In the example illustrated in FIG. 3, the widths W1 of the first adjusting layer A1 are constant from the one end facet P of the integrated semiconductor optical device 1 to the joint boundary K. The first adjusting layer A1 is butt-jointed to an end of the second ridge portion 25 at the butt-joint boundary K. Thus, in the integrated semiconductor optical device 1 according to the first embodiment, there is no necessity of providing a tapering region employed, for example, in Patent Document 1. As a result, the device length of the integrated semiconductor optical device 1 according to the first embodiment can be made smaller than that of integrated semiconductor optical devices having tapering regions described in, for example, Patent Document 1.

In the integrated semiconductor optical device 1, by providing the first adjusting layer A1 on the two side surfaces of the first ridge portion 15, the difference between the beam profile of guided light in the first semiconductor optical device S1 and the beam profile of guided light in the second semiconductor optical device S2 can be reduced. Thus, reflection of guided light at the joint boundary between the first semiconductor optical device S1 and the second semiconductor optical device S2 can be reduced. Accordingly, coupling loss of guided light can be suppressed without a tapering region. Note that the term "beam profile" denotes a beam intensity distribution in a plane orthogonal to the direction of the predetermined axis.

The first semiconductor optical device S1 includes a first optical waveguide including the first upper cladding layer C2, the first core layer 10, and the first lower cladding layer C1. The second semiconductor optical device S2 includes a second optical waveguide including the second upper cladding layer C2, the second core layer 20, and the second lower cladding layer C1. In the first semiconductor optical device S1, light propagates through the first optical waveguide. In the second semiconductor optical device S2, light propagates through the second optical waveguide.

In optical propagation in a waveguide, the beam profile of guided light is determined with an effective refractive index N. The effective refractive index N is calculated by substituting the refractive indices of semiconductor layers constituting the optical waveguide in Maxwell's wave equation.

Hereinafter, the way in which the effective refractive index N is calculated will be described. An electric field E (x, y, z) of guided light propagating through the first semiconductor optical device S1 or the second semiconductor optical device S2 is represented by Equation (1) (Eq. (1)) given below. In the first embodiment, the y direction is the direction in which light propagates. E (x, z) represents an electric field distribution in the xz plane and $\beta$ represents a propagation constant.

$$E(x,y,z) = E(x,z)exp(i\beta y) \quad (1)$$

E (x, z) in Eq. (1) satisfies Maxwell's wave equation (2) given below where n(x, z) represents a refractive index distribution in the xz plane, and $k_0$ represents the wave number of guided light in a vacuum. The wave number $k_0$ satisfies $k_0 = (2\pi)/\lambda$ where $\lambda$ represents the wavelength of guided light in a vacuum.

$$[(\partial^2/\partial x^2)+(\partial^2/\partial z^2)+\{k_0^2 n^2(x,z)-\beta^2\}]E(x,z)=0 \quad (2)$$

By solving Eq. (2) under a boundary condition of a given waveguide, $\beta$ is determined. Then, the effective refractive index N can be calculated with the following relationship given in Eq. (3).

$$\beta = Nk_0 \quad (3)$$

The effective refractive index N is equivalent to the weighted average of the refractive indices of semiconductor layers in a semiconductor optical device in terms of proportions of guided light power in the regions of the semiconductor layers, that is, optical confinement factors. The optical mode distribution within the waveguide is determined by the effective refractive index N, which is the weighted-average refractive index of the waveguide.

When the first semiconductor optical device S1 and the second semiconductor optical device S2 are constituted by different semiconductor layers, the first semiconductor optical device S1 and the second semiconductor optical device S2 have different effective refractive indices. In such a case, by introducing the first adjusting layer A1 having a refractive index and a width for adjusting such an effective refractive index, the effective refractive indices of the first optical waveguide in the first semiconductor optical device S1 and the second optical waveguide in the second semiconductor optical device S2 can be made substantially equal to each other.

Hereinafter, in a case where the effective refractive index of the first optical waveguide in the first semiconductor optical device is lower than the effective refractive index of the second optical waveguide in the second semiconductor optical device prior to the butt jointing of these devices, the principle of reducing the difference between the beam profiles of these devices by using an adjusting layer will be described with reference to FIGS. 4A to 4C.

In the first embodiment, the width W02 of the second ridge portion 25 of the second semiconductor optical device S2 is larger than the width W01 of the first ridge portion 15 of the first semiconductor optical device S1.

FIG. 4A illustrates a beam intensity distribution G1 of a first semiconductor optical device S0 including no adjusting layer. FIG. 4B illustrates a beam intensity distribution G2 of the second semiconductor optical device S2. FIG. 4C illustrates a beam intensity distribution G3 of the first semiconductor optical device S1 including the first adjusting layer A1.

The ridge width W02 of the second semiconductor optical device S2 is larger than the ridge width W01 of the first semiconductor optical device S0. That is, since the relationship of W01<W02 is satisfied, as illustrated in FIGS. 4A and 4B, the beam profile of guided light in the second semiconductor optical device S2 is more broadly distributed than the beam profile of guided light in the first semiconductor optical device S0 in terms of a direction (hereafter, also referred to as a first direction) that is orthogonal to the direction of the predetermined axis Ax and a direction in which the semiconductor layers are stacked. In FIGS. 4A to 4C, the first direction is the X-axis direction. In contrast, due to such a beam distribution, the beam distribution of guided light in the second semiconductor optical device S2 is narrower than the beam distribution of guided light in the first semiconductor optical device S0 in terms of a direction (hereafter, also referred to as a second direction) that is orthogonal to the direction of the predetermined axis Ax and parallel to the direction in which the semiconductor layers are stacked. In FIGS. 4A to 4C, the second direction is the Z-axis direction.

Accordingly, to make the beam profile of the first semiconductor optical device S0 be equivalent to or close to the beam profile of the second semiconductor optical device S2, for example, the first adjusting layer A1 is added on the two side surfaces of the first ridge portion 15 as in the first semiconductor optical device S1 illustrated in FIG. 4C. For example, when the first adjusting layer A1 is composed of a semiconductor material having a refractive index similar to that of the first ridge portion 15, the optical confinement of guided light of the first semiconductor optical device S1 in the first direction is reduced and the guided light distribution is broadened in the first direction, whereas the guided light distribution is narrowed in the second direction due to the broadened distribution in the first direction.

As a result, as illustrated in FIG. 4C, the beam intensity distribution G3 in the first semiconductor optical device S1 has become substantially equivalent to the beam intensity distribution G2 in the second semiconductor optical device S2. The first adjusting layer A1 is added to the first semiconductor optical device S1 such that the effective refractive indices of the first semiconductor optical device S1 and the second semiconductor optical device S2 are made equivalent to each other. For adjusting the effective refractive index of the first semiconductor optical device S1, a width and a refractive index of the first adjusting layer A1 may be selected. Then, in the first semiconductor optical device S1, the guided light distribution is broadened in the first direction. On the other hand, the guided light distribution is narrowed in the second direction. As a result, the guided light distribution of the first semiconductor optical device S1 is equivalent to the guided light distribution of the second semiconductor optical device S2. Thus, the beam intensity distribution G3 of guided light in the first semiconductor optical device S1 can be made substantially equivalent to the beam intensity distribution G2 of the second semiconductor optical device S2, and the beam profile of guided light in the first semiconductor optical device S1 can be made equivalent to the beam profile of guided light in the second semiconductor optical device S2.

Figures 5A, 5B:
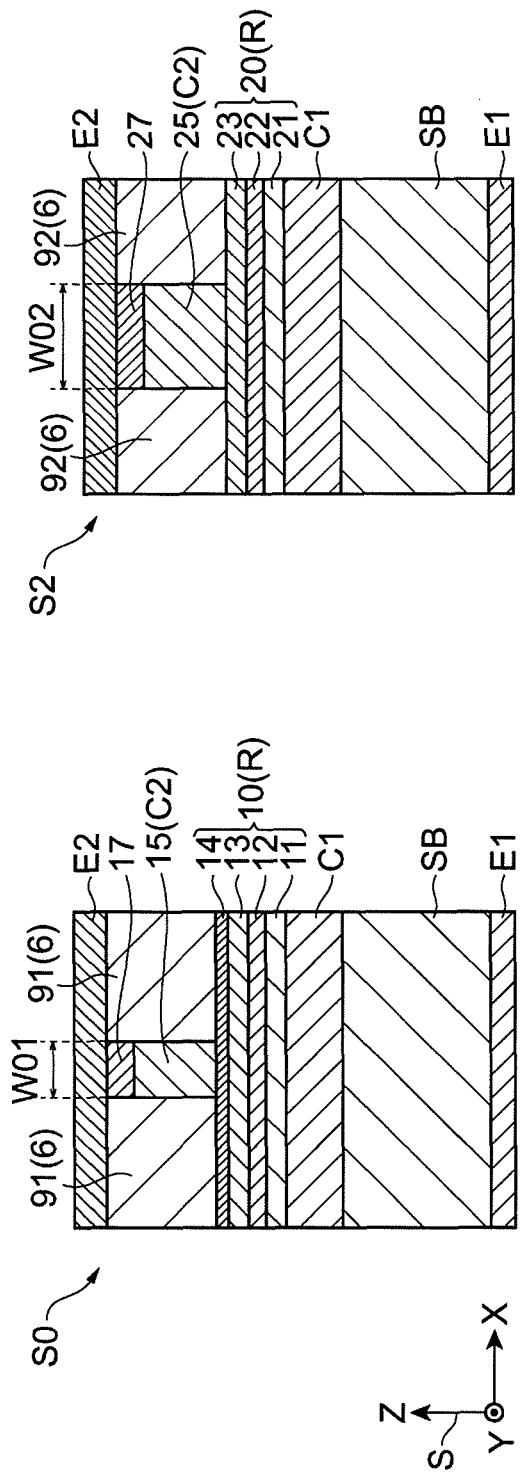
FIG. 5A is a schematic view illustrating a structure used for calculating the effective refractive index of a first semiconductor optical device S0 illustrated in FIG. 4A.
FIG. 5B is a schematic view illustrating a structure used for calculating the effective refractive index of a second semiconductor optical device S2 illustrated in FIG. 4B.

FIG. 5A is a schematic view illustrating the first semiconductor optical device S0 in FIG. 4A. Table I as shown in FIG. 7 illustrates an example of the compositions, thicknesses t, refractive indices n, and width W of the semiconductor layers used for calculating the effective refractive index N of the first semiconductor optical device S0 illustrated in FIG. 5A, and the calculation result of the effective refractive index N.

FIG. 5B is a schematic view illustrating the second semiconductor optical device S2 in FIG. 4B. Table II as shown in FIG. 8 illustrates an example of the compositions, thicknesses t, refractive indices n, and width W of the semiconductor layers used for calculating the effective refractive index N of the second semiconductor optical device S2 illustrated in FIG. 5B, and the calculation result of the effective refractive index N.

Figure 6:
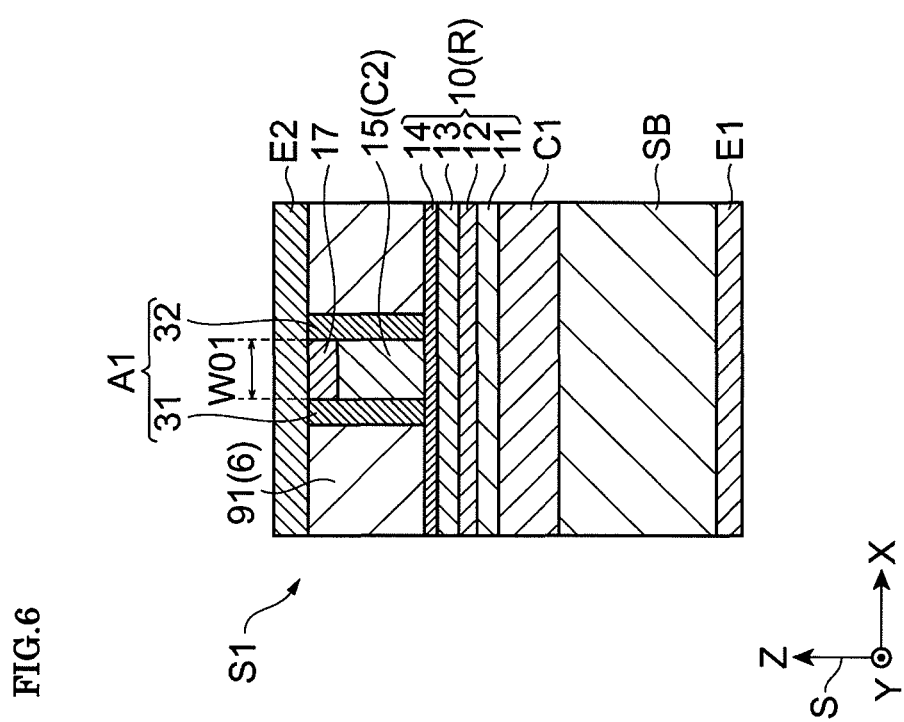
FIG. 6 is a schematic view illustrating a structure used for calculating the effective refractive index of a first semiconductor optical device S1 illustrated in FIG. 4C.

FIG. 6 is a schematic view illustrating the first semiconductor optical device S1 in FIG. 4C. Table III as shown in FIG. 9 illustrates an example of the compositions, thicknesses t, refractive indices n, and widths W of the semiconductor layers used for calculating the effective refractive index N of the first semiconductor optical device S1 illustrated in FIG. 6, and the calculation result of the effective refractive index N.

As illustrated in FIGS. 5A, 5B, and 6, the effective refractive indices are calculated on the basis of the structures in which the height of the first bottom portion B1 of the second cladding layer C2 and the height of the second bottom portion B2 of the second cladding layer C2 are zero and the first bottom portion B1 and the second bottom portion B2 are not present.

In Tables I and III, the grating layers of the first semiconductor optical devices each include semiconductor layers with different compositions and include periodic projections and recesses. Therefore, the compositions and the refractive indices of the grating layers are given as average values of the semiconductor layers in the grating layers. In the structures illustrated in FIGS. 5A, 5B, and 6, since the first upper cladding layer C2 and second upper cladding layer C2 have a large thickness of 3 µm, substantially no guided light is distributed in the contact layers. Accordingly, the contact layers were not considered in the calculations of the effective refractive indices.

When the first adjusting layer A1 is not provided as shown in FIG. 5A, the effective refractive index of the first semiconductor optical device (in the first embodiment, DFB laser diode) S0 is 3.232 as described in Table I. In contrast, the effective refractive index of the second semiconductor optical device (in the first embodiment, EA optical modulator) S2 in FIG. 5B is 3.240 as described in Table II. Thus, the effective refractive index of the first semiconductor optical device S0 is smaller than the effective refractive index of the second semiconductor optical device S2. Accordingly, as illustrated in the first semiconductor optical device S1 in FIGS. 4C and 6, by adding the first adjusting layer A1, the effective refractive index of the first semiconductor optical device S1 can be increased to a value equal to or close to the effective refractive index of the second semiconductor optical device S2. For example, by providing the first adjusting layer A1 (width: 0.2 µm) composed of semi-insulating InP doped with iron (Fe), the effective refractive index of the first semiconductor optical device S1 can be made 3.240 as described in Table III. In this way, the effective refractive indices of the first semiconductor optical device S1 and the second semiconductor optical device S2 can be made substantially equal to each other. Thus, by introducing the first adjusting layer A1, the difference in the beam profile of guided light between the first semiconductor optical device S1 and the second semiconductor optical device S2 can be reduced.

In the semiconductor optical devices joined together by a butt joint method in Patent Document 1, the mode profile of light propagating through one of the semiconductor optical devices is different from the mode profile of light propagating through another one of the semiconductor optical devices. To reduce coupling loss, in Patent Document 1, a tapering region is provided such that the mode profile in the one semiconductor optical device is gradually and continuously made close to the mode profile in the other semiconductor optical device. In contrast, in an embodiment according to the present invention, by introducing an adjusting layer, the beam profile of the first semiconductor optical device S1 and the beam profile of the second semiconductor optical device S2 are made equivalent to each other. Furthermore, the first semiconductor optical device S1 and the second semiconductor optical device S2 are butt-jointed together.

Hereinafter, layers constituting the integrated semiconductor optical device 1 will be described. A height H3 (length in the Z-axis direction) of the bottom portions B1 and B2 of the second cladding layer C2 is preferably, for example, 800 nm or less. When the height H3 of the bottom portion B1 is more than 800 nm, the distance between the first core layer 10 and the first adjusting layer A1 is large and hence the addition of the first adjusting layer A1 is less likely to change the effective refractive index. Thus, in such a case, the beam profile is not effectively adjusted. In addition, when the height H3 of the bottom portion B1 is more than 800 nm, the difference in refractive index between the region where the first ridge portion 15 is formed and its surrounding region is too small. As a result, the mode confinement in the first direction is reduced and the beam profile tends to become unstable.

The first adjusting layer A1 may be formed of a semiconductor material that can be grown on an InP semiconductor substrate SB. The first adjusting layer A1 may be formed of a semiconductor material selected from InP, GaInAsP, GaInAs, AlGaInAs, and AlInAs. Such a semiconductor material has a refractive index of 3.0 or more.

When a semiconductor material is used to form the first adjusting layer A1, the adjusting layer desirably has a high resistance to suppress the current leakage from the first upper cladding layer C2 to the adjusting layer. To make the first adjusting layer A1 have a high resistance, the first adjusting layer A1 is preferably made of semi-insulating semiconductor doped with a deep level impurity such as iron (Fe). When the first adjusting layer A1 is made of InP doped with Fe, for example, the first adjusting layer A1 having a high resistance of more than $10^8$ Ωcm can be provided. As a result, current leakage from the first upper cladding layer C2 to the first adjusting layer A1 can be suppressed.

As the semiconductor substrate SB, for example, an n-type InP substrate is used. The first and second lower cladding layer C1 is composed of a semiconductor material. For example, the first and second lower cladding layer C1 is composed of an n-type semiconductor. Examples of a semiconductor material for forming the first and second lower cladding layer C1 include InP, GaInAsP, GaInAs, AlGaInAs, and AlInAs. To efficiently inject carriers into the active layer 12, the first lower cladding layer C1 is desirably composed of a material having a band gap energy higher than the band gap energy of the active layer 12 and the first lower optical confinement layer 11.

The first core layer 10 and the second core layer 20 are composed of semiconductor materials. A material constituting the active layer 12 has the highest refractive index in the materials constituting the first semiconductor optical device S1. A material constituting the optical absorption layer 22 has the highest refractive index in the materials constituting the second semiconductor optical device S2. The active layer 12 and the optical absorption layer 22 each have a refractive index, for example, in the neighborhood of 3.5. For example, for the active layer 12 and the optical absorption layer 22, a quantum well (QW) structure, a bulk layer, or the like may be employed. The QW structure has quantum well layers and barrier layers which are alternately stacked. Specific examples of a material for forming the active layer 12 and the optical absorption layer 22 include GaInAsP, GaInAs, AlGaInAs, and AlInAs. To suppress optical absorption loss caused by free carriers, the active layer 12 and the optical absorption layer 22 are preferably undoped layers. However, if necessary, the active layer 12 and the optical absorption layer 22 may be doped with a p-type dopant or an n-type dopant. For example, the p-type dopant may be Zn. For example, the n-type dopant may be S or Si.

Specifically, for example, the active layer 12 and the optical absorption layer 22 may have a quantum well structure in which quantum well layers and barrier layers are undoped layers and composed of GaInAsP. When the active layer 12 and the optical absorption layer 22 have a quantum well structure composed of GaInAsP, the integrated semiconductor optical device 1 can be used as an electro absorption modulator integrated laser diode (EML) which can transmit optical signal light having a wavelength in the range of 1.2 µm and 1.55 µm. The optical absorption layer 22 is preferably composed of a material having a band gap energy higher than the band gap energy of the active layer 12. When the optical absorption layer 22 is composed of a material having a band gap energy higher than the band gap energy of the active layer 12, the optical absorption layer 22 is transparent for laser light generated in the active layer 12. As a result, attenuation of signal light power in the optical absorption layer 22 caused by excessive optical absorption can be suppressed.

Specific examples of a material for forming the optical confinement layers (the first lower optical confinement layer 11, the first upper optical confinement layer 13, the second lower optical confinement layer 21, and the second upper optical confinement layer 23) include GaInAsP, GaInAs, AlGaInAs, and AlInAs. The optical confinement layers may be undoped layers. When the optical confinement layers are undoped layers, optical absorption loss caused by free carriers can be suppressed. If necessary, the optical confinement layers may be made to have p-type or n-type conductivity by being doped with p-type or n-type impurities.

In the first semiconductor optical device S1, the first lower optical confinement layer 11 desirably has a band gap energy between the band gap energy of the first lower cladding layer C1 and the band gap energy of the active layer 12; and the first upper optical confinement layer 13 desirably has a band gap energy between the band gap energy of the first upper cladding layer C2 and the band gap energy of the active layer 12. In such a configuration, carriers of electrons and holes are efficiently injected into the active layer 12 from the first lower cladding layer C1 and the first upper cladding layer C2 through the first lower optical confinement layer 11 and the first upper optical confinement layer 13, respectively.

When the above-described band-gap relationships are satisfied, the first lower optical confinement layer 11 has a refractive index between the refractive index of the first lower cladding layer C1 and the refractive index of the active layer 12; and the first upper optical confinement layer 13 has a refractive index between the refractive index of the first upper cladding layer C2 and the refractive index of the active layer 12. Accordingly, in such a configuration, optical confinement within the active layer 12 is enhanced.

Due to the above-described reasons, the introduction of the first lower optical confinement layer 11 and the first upper optical confinement layer 13 can enhance the efficiency of the injection of carriers into the active layer 12 and can also enhance optical confinement within the active layer 12. Accordingly, when the first semiconductor optical device S1 is a laser diode, lasing characteristics and temperature characteristics can be improved. In particular, when the active layer 12 has a quantum well structure, the introduction of the first lower optical confinement layer 11 and the first upper optical confinement layer 13 can considerably enhance optical confinement within the active layer 12. However, the optical confinement layers are not necessarily provided. For example, when the active layer 12 is a bulk layer, optical confinement within the active layer 12 is sufficiently achieved without optical confinement layers. In this case, the first lower optical confinement layer 11 and the first upper optical confinement layer 13 may be omitted.

In the second semiconductor optical device S2, the second lower optical confinement layer 21 desirably has a refractive index between the refractive index of the second lower cladding layer C1 and the refractive index of the optical absorption layer 22; and the second upper optical confinement layer 23 desirably has a refractive index between the refractive index of the second upper cladding layer C2 and the refractive index of the optical absorption layer 22. In such a configuration, guided light is strongly confined within the optical absorption layer 22. Accordingly, change in optical absorption in the optical absorption layer 22 under the application of an electric field can be increased and a good operation as an electro-absorption optical modulator can be achieved. When the optical absorption layer 22 is a bulk layer and optical confinement within the optical absorption layer 22 is sufficiently achieved without optical confinement layers, the second lower optical confinement layer 21 and the second upper optical confinement layer 23 may be omitted.

The grating layer 14 is composed of p-type semiconductors with different compositions. The grating layer 14 includes a diffraction grating. The diffraction grating is composed of two semiconductor layers. One layer has periodic projections and recesses, and another layer is disposed thereon. These two layers have different compositions from each other. For example, in the grating layer 14, one semiconductor layer having periodic projections and recesses is composed of GaInAsP or AlGaInAs. Another semiconductor layer disposed thereon is composed of InP. The diffraction grating is disposed along the predetermined axis Ax. The diffraction grating has a period corresponding to the oscillation wavelength of a DFB laser.

The first and second upper cladding layer C2 is composed of a semiconductor material. The first and second upper cladding layer C2 is composed of, for example, a p-type semiconductor such as InP. To efficiently inject carriers into the active layer 12, the first upper cladding layer C2 is desirably composed of a material having a band gap energy higher than the band gap energy of the active layer 12 and the first upper optical confinement layer 13.

Referring to FIG. 3, the first side surface 15a of the first ridge portion 15 is covered by the first region 91 of the first buried layer 6 with the first portion 31 of the first adjusting layer A1 therebetween; the second side surface 15b of the first ridge portion 15 is covered by the first region 91 of the first buried layer 6 with the second portion 32 of the first adjusting layer A1 therebetween; the third side surface 25a of the second ridge portion 25 is covered by the second region 92 of the second buried layer 6; and the fourth side surface 25b of the second ridge portion 25 is covered by the second region 92 of the second buried layer 6.

The first and second buried layers 6 function as a current blocking layer. In the first embodiment, the first region 91 of the first buried layer 6 is composed of the same material as that of the second region 92 of the second buried layer 6. The first and second buried layers 6 are composed of an insulating material such as a dielectric resin. Examples of the insulating material include benzocyclobutene (BCB) resins and polyimide resins. BCB resins and polyimide resins are low-refractive-index materials having a refractive index in the neighborhood of 1.5. BCB resins and polyimide resins have high resistance. The first and second buried layers 6 composed of a BCB resin or a polyimide resin may be readily formed by a standard semiconductor process. Thus, such first and second buried layers 6 are excellent in terms of productivity and also durability. A material for forming the first and second buried layers 6 are not restricted to a dielectric resin and, for example, may be a semi-insulating semiconductor material doped with an iron (Fe) impurity and having a refractive index lower than the refractive index of the first adjusting layer A1.

Contact layers 17 and 27 form ohmic contacts with an upper electrode E2. The contact layers 17 and 27 may be formed of a p-type semiconductor material doped with a p-type dopant in a high concentration and having a low band gap energy. Specifically, the contact layers 17 and 27 are formed of GaInAsP or GaInAs. Referring to FIG. 1, an insulating material IN of $SiO_2$, SiN, or the like is provided in a region where a portion of the contact layer 27 is removed at the joint boundary K so as to isolate electrically between the first semiconductor optical device S1 and the second semiconductor optical device S2. A lower electrode E1 is provided on the back surface of the semiconductor substrate SB.

To increase optical power emitted from the first semiconductor optical device S1, a high-reflection (HR) film M1 is provided at the one end facet P of the integrated semiconductor optical device 1. To suppress influences of back-reflections of light from the other end facet Q of the integrated semiconductor optical device 1 on device characteristics, a anti-reflection (AR) film M2 is provided at the other end facet Q of the integrated semiconductor optical device 1.

Hereinafter, an example of a method for producing the integrated semiconductor optical device 1 will be described with reference to FIGS. 10A to 10G, 11A to 11D, 12A to 12D, and 13A to 13D. FIGS. 10A to 10D, 11A, 11B, 12A, 12B, 13A, and 13B illustrate sectional views of the first semiconductor optical device S1 that are parallel to the xz plane as in the sectional view taken along line IIA-IIA in FIG. 1. FIGS. 10E to 10G, 11C, 11D, 12C, 12D, 13C, and 13D illustrate sectional views of the second semiconductor optical device S2 that are parallel to the xz plane as in the sectional view taken along line IIB-IIB in FIG. 1.

Referring to FIG. 10A, the first lower cladding layer C1 and the first core layer 10 are grown on the entirety of the main surface a1 of the semiconductor substrate SB. As the first core layer 10, the first lower optical confinement layer 11, the active layer 12, the first upper optical confinement layer 13, and the grating layer 14 are sequentially grown. The crystal growth may be performed by, for example, a metal-organic vapor phase epitaxy (MOVPE) method or a molecular beam epitaxy (MBE) method. Then, a diffraction grating having a period corresponding to the oscillation wavelength of a DFB laser is formed on the grating layer 14 by an interference exposure method, an electron beam (EB) exposure method, or the like.

After that, referring to FIG. 10B, a semiconductor layer C2a and a semiconductor layer 17a are sequentially grown on the first core layer 10 over the entirety of the main surface a1 of the semiconductor substrate SB. As a result, as illustrated in FIG. 10B, semiconductor layers for constituting the first semiconductor optical device S1 are formed over the entire surface of the semiconductor substrate SB. Then, only in a region in which the first semiconductor optical device S1 is to be provided on the semiconductor substrate SB, the surface of the semiconductor layer 17a is covered by a dielectric mask (not shown) composed of SiN, $SiO_2$, or the like. In the other region, that is, in a region in which the second semiconductor optical device S2 is to be provided, the first core layer 10, the semiconductor layer C2a, and the semiconductor layer 17a that are stacked on the first lower cladding layer C1 are removed by etching by using the dielectric mask to expose the first lower cladding layer C1. In this etching, since the region in which the first semiconductor optical device S1 is to be provided is covered by the dielectric mask and hence is not etched. Then, the second core layer 20, the semiconductor layer C2a, and the semiconductor layer 17a are sequentially and selectively grown on the first lower cladding layer C1 by using the dielectric mask for the selective growth. In this case, the second core layer 20 includes the second lower optical confinement layer 21, the optical absorption layer 22, and the second upper optical confinement layer 23. As a result, as illustrated in FIG. 10E, semiconductor layers for constituting the second semiconductor optical device S2 are formed. In the region of the second semiconductor optical device S2, the first lower cladding layer C1 functions as the second lower cladding layer. At this time, the surface of the region in which the first semiconductor optical device S1 is to be provided is covered by the dielectric mask as described above. Therefore, in this region, the second core layer 20, the semiconductor layer C2a, and the semiconductor layer 17a are not grown. Thus, in this region, the device structure illustrated in FIG. 10B is remained. As a result, a structure is formed in which the semiconductor layers constituting the first semiconductor optical device S1 and the semiconductor layers constituting the second semiconductor optical device S2 are integrated together by butt joint at the boundary plane between the devices.

The dielectric mask covering the region for the first semiconductor optical device S1 is subsequently removed. Then, referring to FIG. 10C, a mask 18 is newly provided on a portion of the semiconductor layer 17a in the first semiconductor optical device S1. Referring to FIG. 10F, a mask 28 is provided on a portion of the semiconductor layer 17a in the second semiconductor optical device S2. In an example, the width of the mask 28 is larger than the width of the mask 18. The masks 18 and 28 may be constituted by dielectric films composed of, for example, SiN, $SiO_2$, or the like. The semiconductor layer 17a and the semiconductor layer C2a are etched through the masks 18 and 28. As a result, referring to FIG. 10D, the contact layer 17 and the first upper cladding layer C2 including the first ridge portion 15 and the first bottom portion B1 are provided in the first semiconductor optical device S1; and referring to FIG. 10G, the contact layer 27 and the second upper cladding layer C2 including the second ridge portion 25 and the second bottom portion B2 are provided in the second semiconductor optical device S2.

Then, referring to FIGS. 11A and 11C, a semiconductor layer A1a is grown on the first side surface 15a and the second side surface 15b of the first ridge portion 15 and on the third side surface 25a and the fourth side surface 25b of the second ridge portion 25 by a metal-organic vapor phase epitaxy (MOVPE) method, a molecular beam epitaxy (MBE) method, or the like. The semiconductor layer A1a is formed such that the first ridge portion 15 and the second ridge portion 25 are buried by the semiconductor layer A1a. If necessary, a planarizing treatment is performed such that the surface of the semiconductor layer A1a is flattened against the top surfaces of the contact layers 17 and 27. As a result, buried ridge structures are formed for the first semiconductor optical device S1 and the second semiconductor optical device S2. Thus, a structure in which the first semiconductor optical device S1 and the second semiconductor optical device S2 have been integrated together by butt joint is provided. Then, referring to FIG. 11B, a mask 19 having a width larger than the width W01 of the first ridge portion 15 is formed in the first semiconductor optical device S1. The mask 19 is formed on the contact layer 17 and on a portion of the semiconductor layer A1a on the first ridge portion 15 side. Referring to FIG. 11D, a mask 29 substantially having the same width as the width of the contact layer 27 is formed on the contact layer 27 in the second semiconductor optical device S2. The masks 19 and 29 may be constituted by dielectric films composed of, for example, SiN, $SiO_2$, or the like.

Figure 12A:
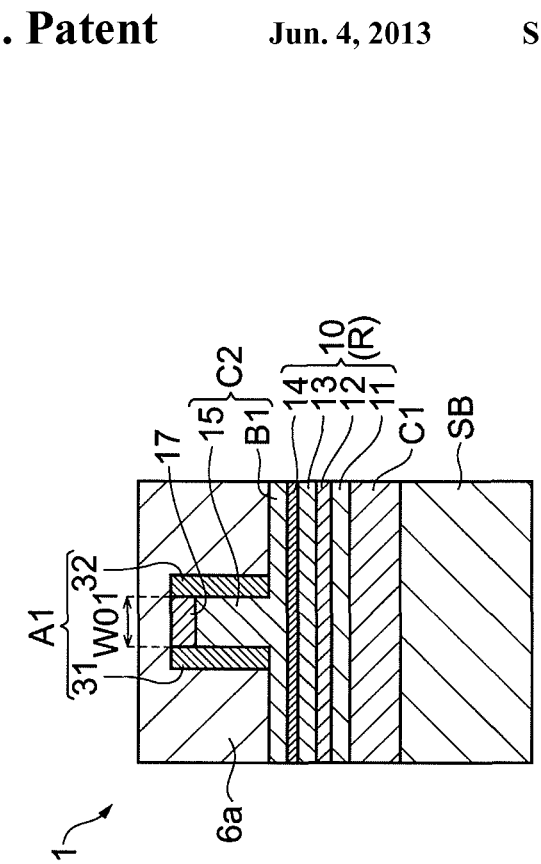
FIGS. 12A to 12D are schematic views illustrating an example of a method for producing an integrated semiconductor optical device according to the first embodiment.
Figure 12B:
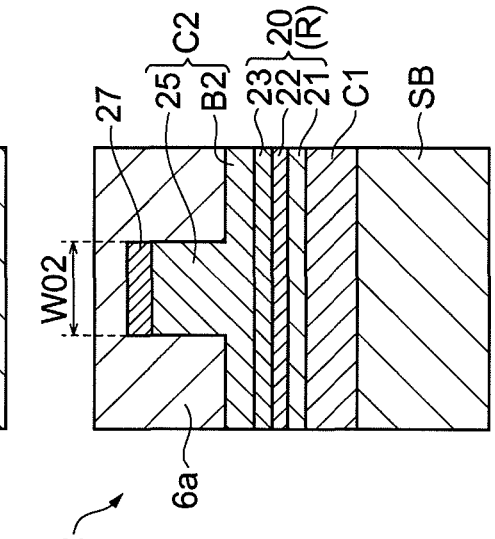
Figure 12C:
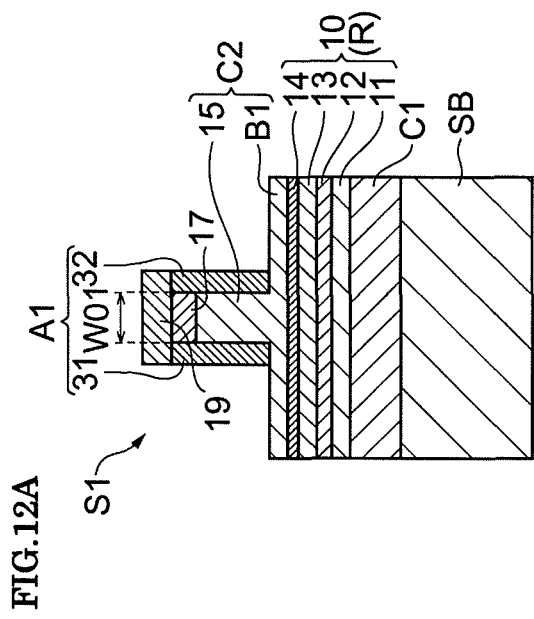
Figure 12D:
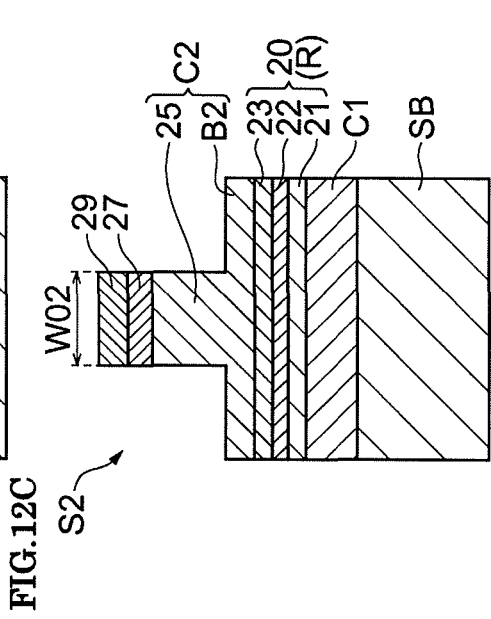

Then, the semiconductor material A1a is etched by using the masks 19 and 29 as an etching mask. As a result, referring to FIGS. 12A and 12C, the first adjusting layer A1 including the first portion 31 and the second portion 32 is formed in the first semiconductor optical device S1; and the semiconductor material A1a is removed in the second semiconductor optical device S2. The width of the mask 19 is selected so that the width of the first adjusting layer A1 after the etching is made to be a width for adjusting the effective refractive index at the butt-joint boundary K. As illustrated in FIG. 12C, in the second semiconductor optical device S2, the semiconductor material A1a is completely removed and hence no adjusting layer is provided. Then, the masks 19 and 29 are removed. Referring to FIGS. 12B and 12D, a dielectric resin 6a such as a BCB resin or a polyimide resin is subsequently applied to the entire surface of the wafer in the first semiconductor optical device S1 and the second semiconductor optical device S2. Then, referring to FIGS. 13A and 13C, in the first semiconductor optical device S1 and the second semiconductor optical device S2, the resultant excessive resin layer over the surfaces of the contact layers 17 and 27 is removed by, for example, dry etching to expose the surfaces of the contact layers 17 and 27. Thus, the first and second buried layers 6 are provided.

Figure 13A:
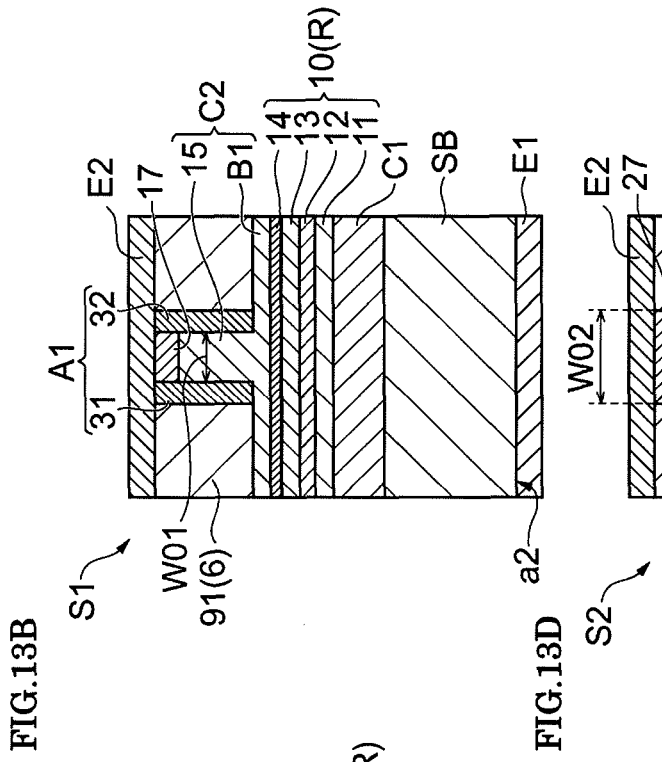
FIGS. 13A to 13D are schematic views illustrating an example of a method for producing an integrated semiconductor optical device according to the first embodiment.
Figure 13C:
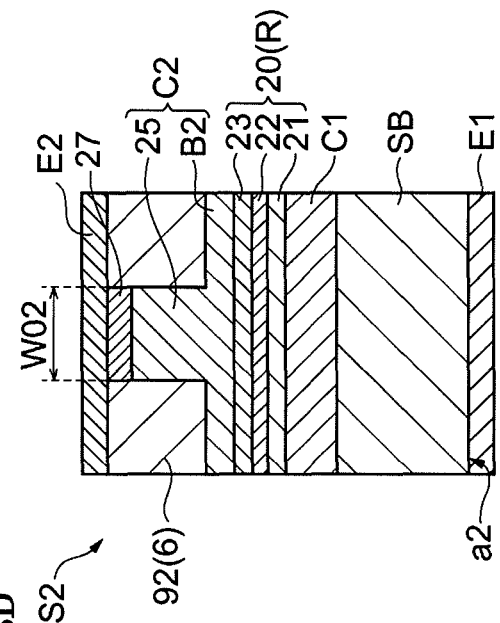
Figure 13B:
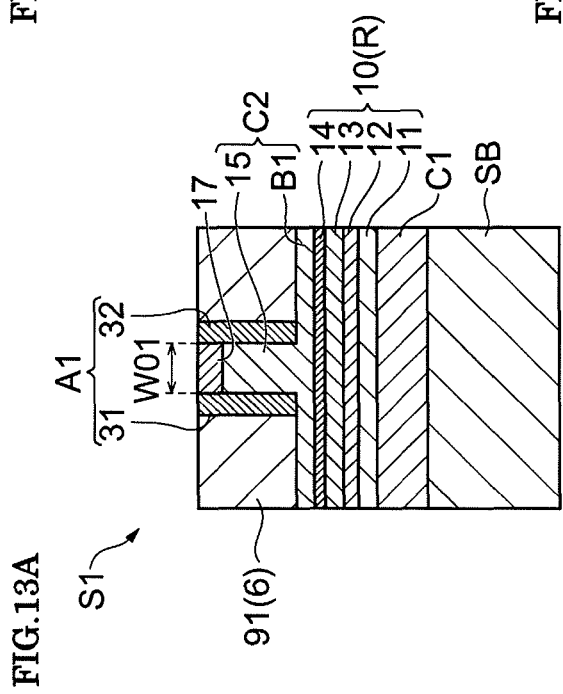
Figure 13D:
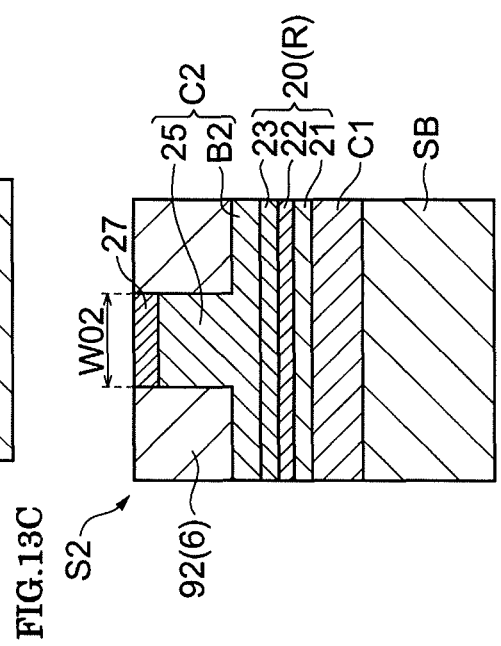

Then, a portion of the contact layer 27 of the second semiconductor optical device S2 close to the joint boundary K is removed. Referring to FIG. 1 again, the insulating material IN is formed in the resultant region in which the portion of the contact layer 27 is removed. Then, referring to FIGS. 13B and 13D, the upper electrode E2 is formed on the contact layers 17 and 27 in the first semiconductor optical device S1 and the second semiconductor optical device S2 by a deposition method, a sputtering method, or the like. After that, the thickness of the semiconductor substrate SB is reduced by polishing to a thickness of, for example, 100 μm or less. Then, as illustrated in FIGS. 13B and 13D, the lower electrode E1 is provided on the back surface a2 of the semiconductor substrate SB in the first semiconductor optical device S1 and the second semiconductor optical device S2 by a deposition method, a sputtering method, or the like. As a result of the above-described steps, the production of the integrated semiconductor optical device 1 has been completed.

Hereinafter, an example of the operation of the integrated semiconductor optical device 1 will be described. When the first semiconductor optical device S1 is a distributed feedback laser diode, current is injected into the active layer 12. Then, electrons and holes are recombined in the active layer 12 to thereby cause light emission. As the injected current increases, the intensity of the light emission increases. When a current higher than the threshold current is injected into the distributed feedback laser diode, laser oscillation is occurred. Lasing wavelength of the distributed feedback laser diode depends on the period of the diffraction grating of the grating layer 14. When the second semiconductor optical device S2 is an electro-absorption optical modulator, reverse bias is applied to the electro-absorption optical modulator. Optical absorption in the optical absorption layer 22 increases with reverse bias voltage applied to the electro-absorption optical modulator. A high optical output is obtained when a low voltage is applied to the electro-absorption optical modulator in accordance with the external modulation signals corresponding to the level "1". On the other hand, a low optical output is obtained when a high voltage is applied to the electro-absorption optical modulator in accordance with the external modulation signals corresponding to the level "0". Accordingly, by changing the magnitude of a reverse bias voltage applied to the second semiconductor optical device S2 in accordance with an external modulation signal pattern, laser light emitted from the first semiconductor optical device S1 is modulated and emitted to the outside.

Second Embodiment

Figure 15:
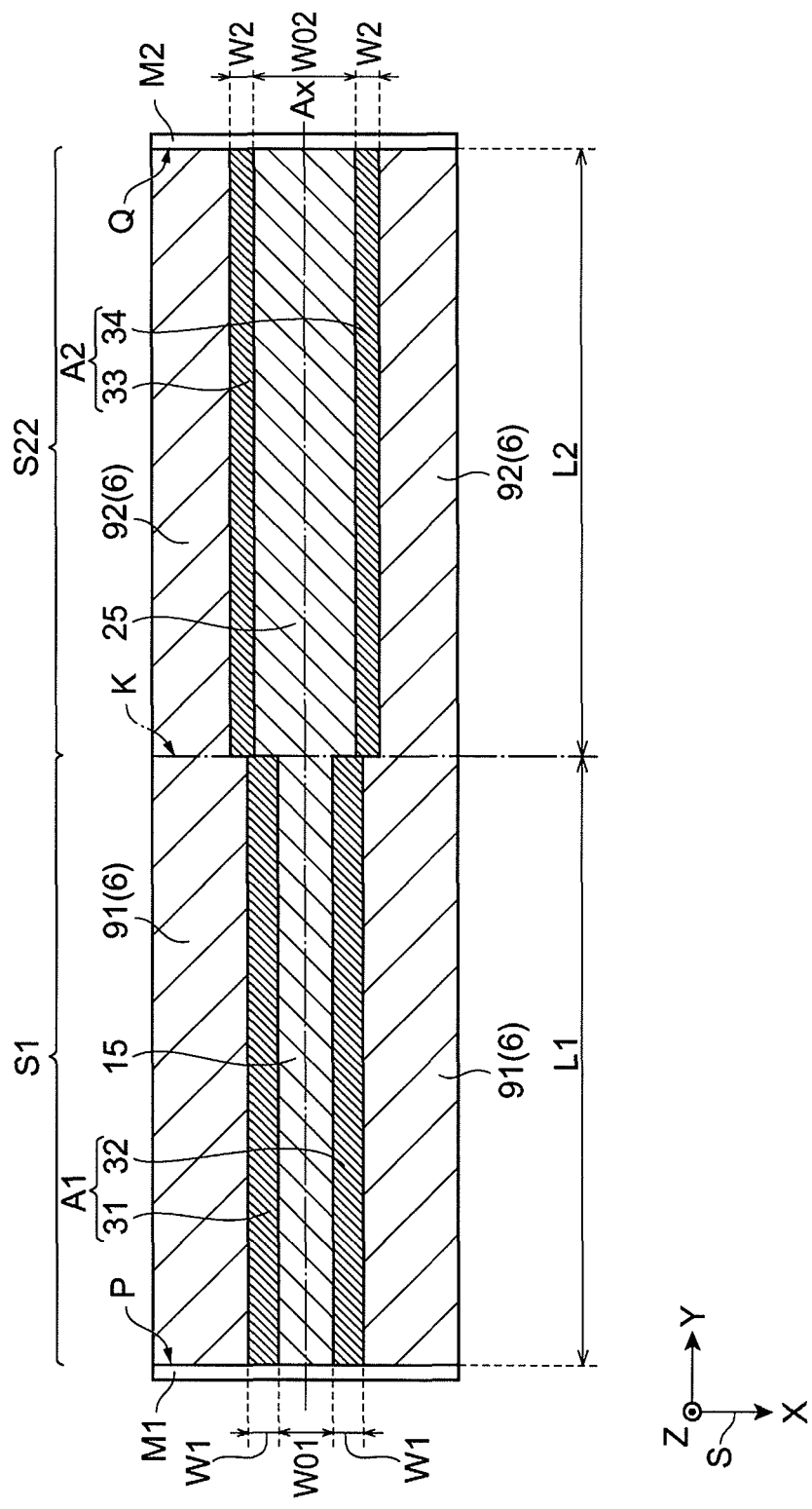
FIG. 15 is a sectional view illustrating a modification of the configuration in FIG. 3.

Hereinafter, an integrated semiconductor optical device according to a second embodiment will be described with reference to FIGS. 14A, 14B, 15, and 16A to 16D. FIGS. 14A and 14B are sectional views illustrating a modification of the configurations in FIGS. 2A and 2B. FIG. 15 is a sectional view illustrating a modification of the configuration in FIG. 3. FIGS. 16A to 16D illustrate examples of a beam intensity distribution of guided light. The only difference of the integrated semiconductor optical device according to the second embodiment from the integrated semiconductor optical device 1 according to the first embodiment is an adjusting layer. Thus, descriptions other than the adjusting layer are omitted.

Referring to FIG. 14A, like the first semiconductor optical device S1 according to the first embodiment, the first semiconductor optical device S1 according to the second embodiment includes the first adjusting layer A1. Referring to FIG. 14B, unlike the second semiconductor optical device S2 according to the first embodiment, a second semiconductor optical device S22 according to the second embodiment further includes a second adjusting layer A2.

The second adjusting layer A2 is formed of a material that is the same as or different from that of the first adjusting layer A1. A material with which the first adjusting layer A1 can be formed may be used for forming the second adjusting layer A2. The second adjusting layer A2 has a refractive index lower than the refractive index of the second core layer 20 and higher than the refractive index of the second region 92 of the second buried layer 6. The second adjusting layer A2 is provided between the second buried layer 6 and the second ridge portion 25. The second adjusting layer A2 extends in the direction of the predetermined axis Ax so as to be in contact with the second ridge portion 25. The second adjusting layer A2 includes a third portion 33 and a fourth portion 34 that extend in the direction of the predetermined axis Ax. The third portion 33 of the second adjusting layer A2 is in contact with the third side surface 25a of the second ridge portion 25. The fourth portion 34 of the second adjusting layer A2 is in contact with the fourth side surface 25b of the second ridge portion 25. The third portion 33 of the second adjusting layer A2 is provided between the second region 92 of the second buried layer 6 and the third side surface 25a of the second ridge portion 25. The fourth portion 34 of the second adjusting layer A2 is provided between the second region 92 of the second buried layer 6 and the fourth side surface 25b of the second ridge portion 25. In the second embodiment, the second adjusting layer A2 is in contact with the second buried layer 6. The third portion 33 and the fourth portion 34 of the second adjusting layer A2 are provided so as to be separated from each other.

In an example illustrated in FIG. 15, the first portion 31 of the first adjusting layer A1 is in contact with the third portion 33 of the second adjusting layer A2 at the butt-joint boundary K. The second portion 32 of the first adjusting layer A1 is in contact with the fourth portion 34 of the second adjusting layer A2 at the joint boundary K. The width (length in the X-axis direction) of the third portion 33 of the second adjusting layer A2 is the same as the width (length in the X-axis direction) of the fourth portion 34 of the second adjusting layer A2. In FIGS. 14A, 14B and 15, the widths of the third portion 33 and the fourth portion 34 of the second adjusting layer A2 are represented by W2. The widths W2 of the second adjusting layer A2 are constant in a neighboring region of the butt-joint boundary K and the second adjusting layer A2 does not have a tapering shape.

The widths W2 of the second adjusting layer A2 in a direction (hereafter, also referred to as a first direction) that is orthogonal to the direction of the predetermined axis Ax and parallel to the semiconductor substrate SB are constant. In FIG. 15, the first direction is the X-axis direction. The widths W2 of the second adjusting layer A2 are constant from the other end facet Q of the integrated semiconductor optical device 1 to the butt-joint boundary K.

The first adjusting layer A1 and the second adjusting layer A2 are butt-jointed together at the butt-joint boundary K so as to correspond to each other.

In the second embodiment, at the joint boundary K, the first portion 31 of the first adjusting layer A1 is joined to the third portion 33 of the second adjusting layer A2 in a stepped configuration; the second portion 32 of the first adjusting layer A1 is joined to the fourth portion 34 of the second adjusting layer A2 in a stepped configuration. At the joint boundary K, the width W1 of the first portion 31 of the first adjusting layer A1 is different from the width W2 of the third portion 33 of the second adjusting layer A2; and the width W1 of the second portion 32 of the first adjusting layer A1 is different from the width W2 of the fourth portion 34 of the second adjusting layer A2. In the example illustrated in FIGS. 14A, 14B, and 15, the width W1 of the first portion 31 is larger than the width W2 of the third portion 33; and the width W1 of the second portion 32 is larger than the width W2 of the fourth portion 34. For example, the widths W2 of the third portion 33 and the fourth portion 34 can be made 100 nm to 500 nm. A height H2 (length in the Z-axis direction) of the second adjusting layer A2 can be made 1.5 µm to 3.0 µm. A length L2 (length in the Y-axis direction) of the second adjusting layer A2 can be made 50 µm to 300 µm.

By adjusting the widths W1 of the first portion 31 and the second portion 32 and the widths W2 of the third portion 33 and the fourth portion 34 and, if necessary, by also adjusting the width W01 of the first ridge portion 15 and the width W02 of the second ridge portion 25, the difference in the beam profile of guided light between the first semiconductor optical device S1 and the second semiconductor optical device S22 can be readily reduced.

When the first adjusting layer A1 and the second adjusting layer A2 have the same refractive index, the effective refractive indices may be adjusted in the following manner. When the effective refractive index of the second optical waveguide in the second semiconductor optical device is higher than the effective refractive index of the first optical waveguide in the first semiconductor optical device, for example, the widths W1 of the first adjusting layer A1 are made larger than the widths W2 of the second adjusting layer A2. Alternatively, when the effective refractive index of the second optical waveguide in the second semiconductor optical device is lower than the effective refractive index of the first optical waveguide in the first semiconductor optical device, for example, the widths W1 of the first adjusting layer A1 are made smaller than the widths W2 of the second adjusting layer A2.

On the other hand, when the first adjusting layer A1 has a refractive index higher than the refractive index of the second adjusting layer A2, the effective refractive indices may be adjusted in the following manner. When the effective refractive index of the second optical waveguide in the second semiconductor optical device is higher than the effective refractive index of the first optical waveguide in the first semiconductor optical device, the effective refractive indices may be adjusted by, for example, making the widths W1 of the first adjusting layer A1 be smaller than the widths W2 of the second adjusting layer A2.

Figures 16A, 16B, 16C, 16D:
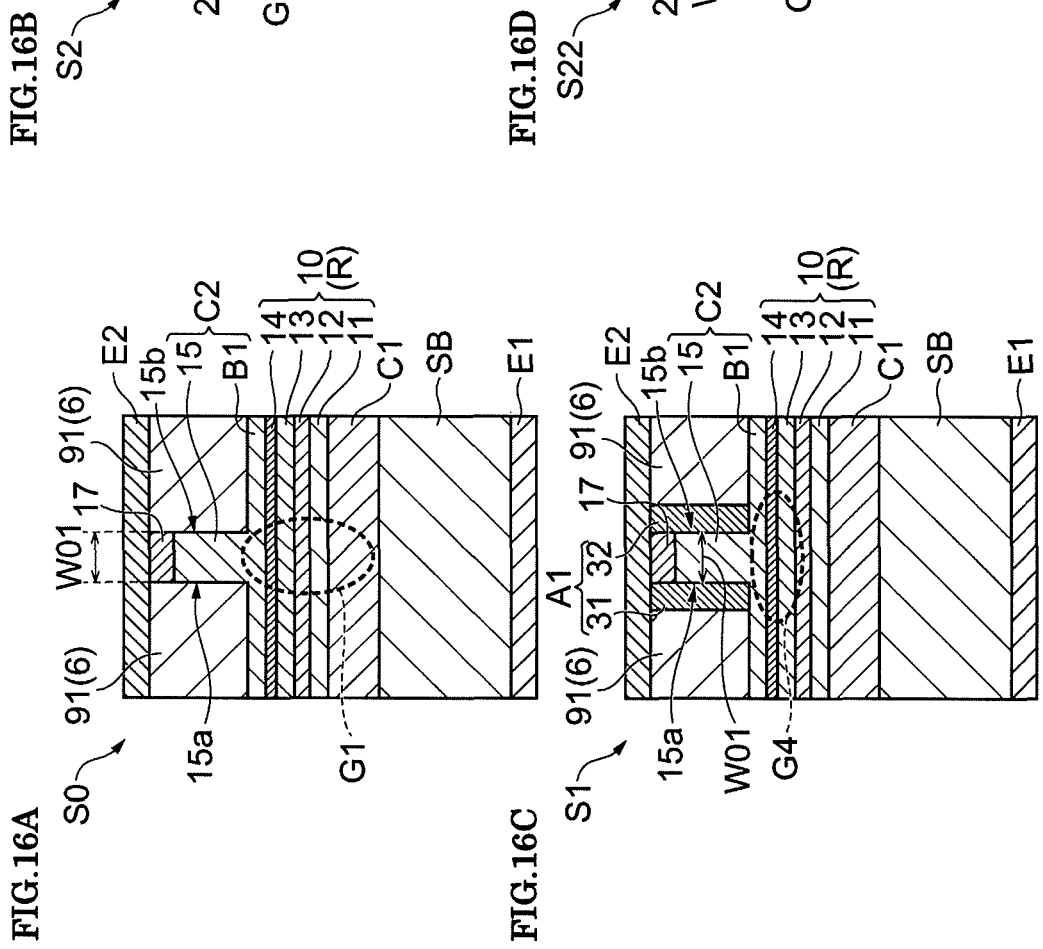
FIGS. 16A to 16D illustrate examples of a beam intensity distribution of guided light.

FIG. 16A illustrates a beam intensity distribution G1 of the first semiconductor optical device S0 including no adjusting layer. FIG. 16B illustrates a beam intensity distribution G2 of the second semiconductor optical device S2 including no adjusting layer. FIG. 16C illustrates a beam intensity distribution G4 of the first semiconductor optical device S1 including the first adjusting layer A1. FIG. 16D illustrates a beam intensity distribution G5 of the second semiconductor optical device S22 including the second adjusting layer A2.

In the second embodiment, the width W02 of the second ridge portion 25 of the second semiconductor optical device S2 is larger than the width W01 of the first ridge portion 15 of the first semiconductor optical device S0.

That is, since the relationship of W02>W01 is satisfied, as illustrated in FIGS. 16A and 16B, guided light in the second semiconductor optical device S2 is more broadly distributed than guided light in the first semiconductor optical device S0 in a direction (hereafter, referred to as a first direction) that is orthogonal to the direction of the predetermined axis Ax and a direction in which the semiconductor layers are stacked. In FIGS. 16A and 16B, the first direction is the X-axis direction. In contrast, due to this distribution in the first direction, guided light in the second semiconductor optical device S2 is more narrowly distributed than guided light in the first semiconductor optical device S0 in terms of a direction (hereafter, referred to as a second direction) that is orthogonal to the direction of the predetermined axis Ax and parallel to the direction in which the semiconductor layers are stacked. In FIGS. 16A and 16B, the second direction is the Z-axis direction. In such a case, the effective refractive index of the second semiconductor optical device S2 is higher than the effective refractive index of the first semiconductor optical device S0.

Accordingly, to make the beam profile of the first semiconductor optical device S0 and the beam profile of the second semiconductor optical device S2 be equivalent to or close to each other, for example, as illustrated in FIG. 16C, the first adjusting layer A1 is added on the two side surfaces 15a, 15b of the first ridge portion 15 in the first semiconductor optical device S1. And, as illustrated in FIG. 16D, the second adjusting layer A2 is added on the two side surfaces 25a, 25b of the second ridge portion 25 in the second semiconductor optical device S22. The second adjusting layer A2 has the same refractive index as the first adjusting layer A1 and has the widths W2 smaller than the widths W1 of the first adjusting layer A1. For example, when the first adjusting layer A1 and the second adjusting layer A2 are composed of a semiconductor material having a refractive index similar to that of the first ridge portion 15 and the second ridge portion 25, the optical confinement of guided light both in the first and second semiconductor optical devices in the first direction is reduced due to the addition of the first adjusting layer A1 and the second adjusting layer A2. As a result of this reduction in the optical confinement, the guided light distribution is broadened in the first direction. In contrast, the guided light distribution is narrowed in the second direction due to the broadened distribution in the first direction. However, since the widths W2 of the second adjusting layer A2 are smaller than the widths W1 of the first adjusting layer A1, guided light in the first semiconductor optical device S1 is broadly distributed in the first direction and conversely narrowly distributed in the second direction compared with guided light in the second semiconductor optical device S22. As a result, the beam profiles of guided light in the first semiconductor optical device and the second semiconductor optical device can be made substantially equivalent to each other.

The first adjusting layer A1 and the second adjusting layer A2 that have widths and refractive indices for adjusting the effective refractive indices of the first semiconductor optical device S1 and the second semiconductor optical device S22 are added such that these effective refractive indices are made equivalent to each other. As a result, guided light distributions in the first semiconductor optical device S1 and the second semiconductor optical device S22 are made equivalent to each other in terms of the first direction and the second direction. Accordingly, as illustrated in FIGS. 16C and 16D, the beam intensity distribution G4 of guided light in the first semiconductor optical device S1 and the beam intensity distribution G5 of guided light in the second semiconductor optical device S22 can be substantially made beam profiles equivalent to each other. In this way, the beam profile of guided light in the first semiconductor optical device S1 and the beam profile of guided light in the second semiconductor optical device S22 can be substantially made equivalent to each other.

In summary, by respectively introducing the first adjusting layer A1 and the second adjusting layer A2 into the first semiconductor optical device S1 and the second semiconductor optical device S22, the effective refractive indices of the first semiconductor optical device S1 and the second semiconductor optical device S22 can be substantially made equal to each other. The difference in effective refractive index between the first semiconductor optical device S1 and the second semiconductor optical device S22 can be reduced. Accordingly, the difference in beam profile of guided light between the first semiconductor optical device S1 and the second semiconductor optical device S22 can be reduced without a tapering region. Thus, reflection or scattering of guided light at the joint boundary between the first semiconductor optical device S1 and the second semiconductor optical device S22 and coupling loss caused by the reflection or scattering of guided light can be suppressed.

Hereinafter, a method for forming the second adjusting layer A2 will be described. For example, in FIG. 11D illustrating the production method described in the first embodiment, to form the second adjusting layer A2, the width of the mask 29 is made larger than the width W02 of the second ridge portion 25 in the second embodiment. That is, in the second embodiment, the mask 29 is formed so as to cover the contact layer 27 and a portion of the semiconductor layer A1a on the second ridge portion 25 side. Then, the semiconductor layer A1a is etched by using the masks 19 and 29 as an etching mask. As a result, the first adjusting layer A1 is formed in the first semiconductor optical device S1 and the second adjusting layer A2 is formed in the second semiconductor optical device S22. By appropriately changing the widths of the masks 19 and 29, the widths W1 of the first adjusting layer A1 and the widths W2 of the second adjusting layer A2 can be changed.

Third Embodiment

Figure 17A:
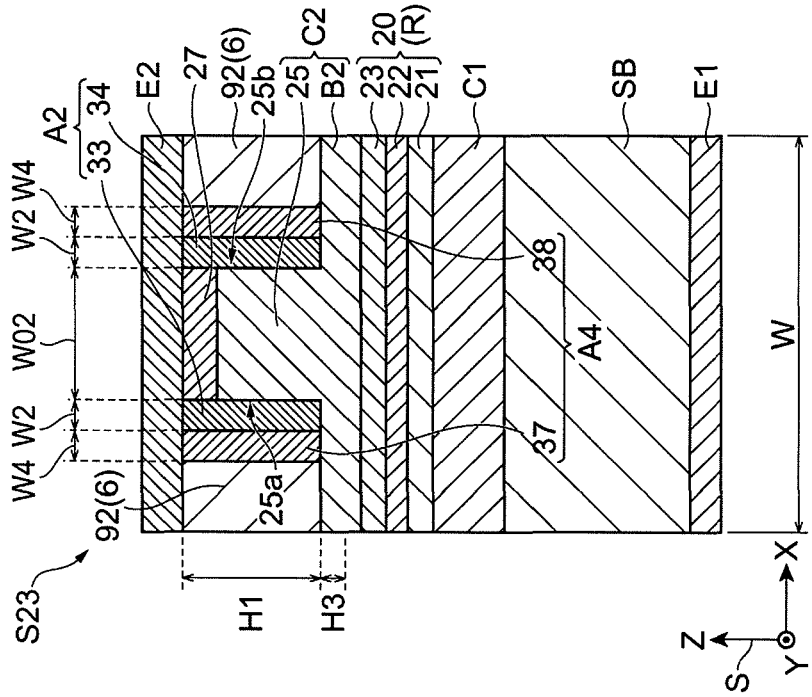
FIGS. 17A and 17B are sectional views illustrating a modification of the configurations in FIGS. 2A and 2B.
Figure 17B:
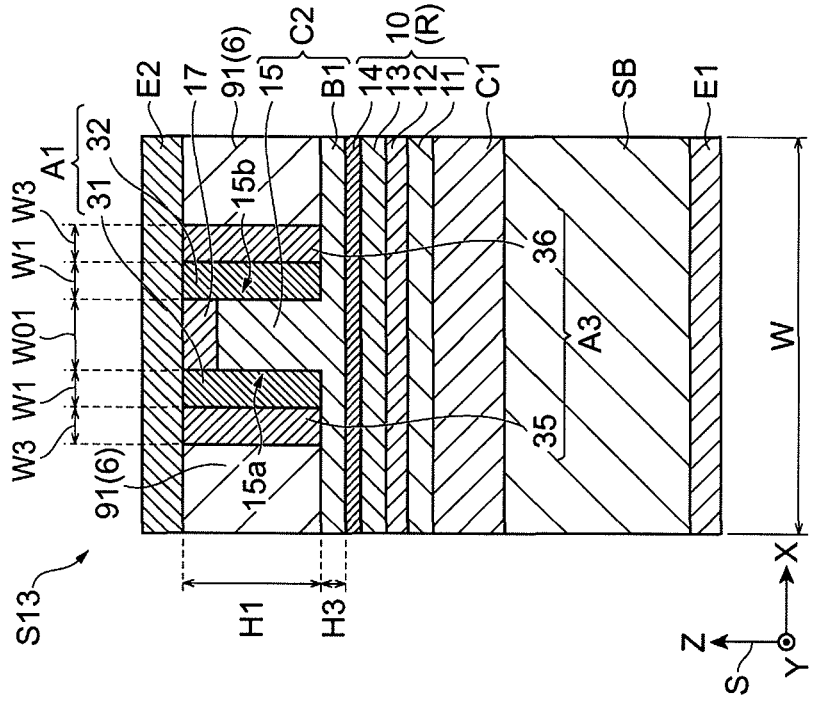
Figure 18:
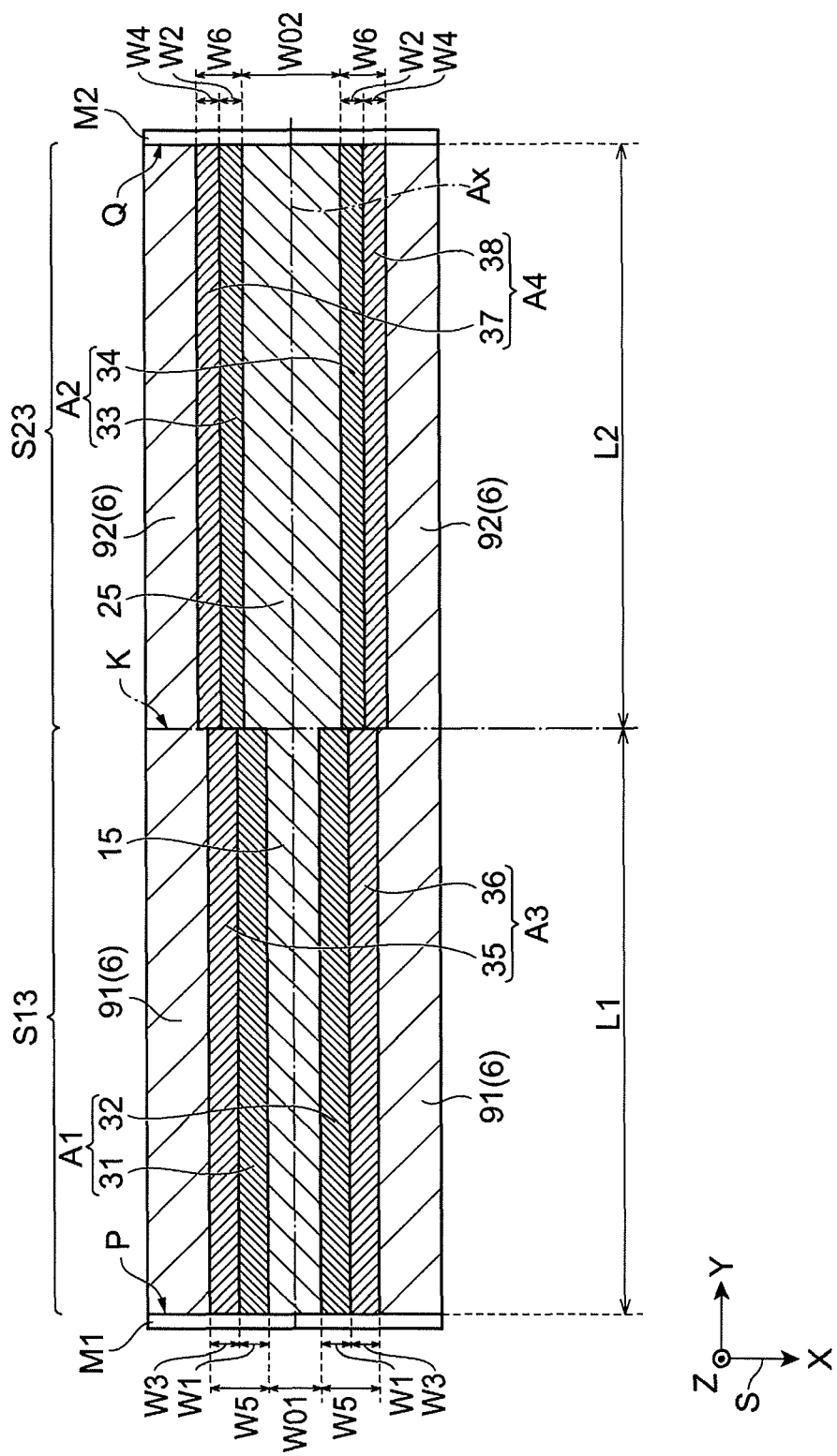
FIG. 18 is a sectional view illustrating a modification of the configuration in FIG. 3.

Hereinafter, an integrated semiconductor optical device according to a third embodiment will be described with reference to FIGS. 17A, 17B, and 18. FIGS. 17A and 17B are sectional views illustrating a modification of the configurations in FIGS. 2A and 2B. FIG. 18 is a sectional view illustrating a modification of the configuration in FIG. 3. The only differences of the integrated semiconductor optical device according to the third embodiment from the integrated semiconductor optical device according to the first embodiment are adjusting layers. Thus, descriptions other than the adjusting layers are omitted.

Referring to FIG. 17A, a first semiconductor optical device S13 of the integrated semiconductor optical device according to the third embodiment includes a third adjusting layer A3 in addition to the first adjusting layer A1. The third adjusting layer A3 includes a fifth portion 35 and a sixth portion 36 that extend in the direction of the predetermined axis Ax. The fifth portion 35 and the sixth portion 36 of the third adjusting layer A3 are provided so as to be separated from each other. The fifth portion 35 of the third adjusting layer A3 is provided between the first portion 31 of the first adjusting layer A1 and the first region 91 of the first buried layer 6. In the third embodiment, the fifth portion 35 of the third adjusting layer A3 is in contact with the first portion 31 of the first adjusting layer A1 and the first region 91 of the first buried layer 6. The sixth portion 36 of the third adjusting layer A3 is provided between the second portion 32 of the first adjusting layer A1 and the first region 91 of the first buried layer 6. In the third embodiment, the sixth portion 36 of the third adjusting layer A3 is in contact with the second portion 32 of the first adjusting layer A1 and the first region 91 of the first buried layer 6. The third adjusting layer A3 has a refractive index lower than the refractive index of the first adjusting layer A1 and higher than the refractive index of the first region 91 of the first buried layer 6.

Referring to FIG. 17B, a second semiconductor optical device S23 of the integrated semiconductor optical device according to the third embodiment includes the second adjusting layer A2 and a fourth adjusting layer A4. The fourth adjusting layer A4 includes a seventh portion 37 and an eighth portion 38 that extend in the direction of the predetermined axis Ax. The seventh portion 37 and the eighth portion 38 of the fourth adjusting layer A4 are provided so as to be separated from each other. The seventh portion 37 of the fourth adjusting layer A4 is provided between the third portion 33 of the second adjusting layer A2 and the second region 92 of the second buried layer 6. In the third embodiment, the seventh portion 37 of the fourth adjusting layer A4 is in contact with the third portion 33 of the second adjusting layer A2 and the second region 92 of the second buried layer 6. The eighth portion 38 of the fourth adjusting layer A4 is provided between the fourth portion 34 of the second adjusting layer A2 and the second region 92 of the second buried layer 6. In the third embodiment, the eighth portion 38 of the fourth adjusting layer A4 is in contact with the fourth portion 34 of the second adjusting layer A2 and the second region 92 of the second buried layer 6. The fourth adjusting layer A4 has a refractive index lower than the refractive index of the second adjusting layer A2 and higher than the refractive index of the second region 92 of the second buried layer 6.

The widths W3 of the third adjusting layer A3 and the widths W4 of the fourth adjusting layer A4 are constant in neighboring regions of the butt-joint boundary K and the third adjusting layer A3 and the fourth adjusting layer A4 do not have a tapering shape. The widths W3 of the third adjusting layer A3 and the widths W4 of the fourth adjusting layer A4 are constant.

The widths W3 of the third adjusting layer A3 and the widths W4 of the fourth adjusting layer A4 in a direction (hereafter, referred to as a first direction) that is orthogonal to the direction of the predetermined axis Ax and parallel to the semiconductor substrate SB are constant. In FIGS. 17A, 17B, and 18, the first direction is the X-axis direction. In the example illustrated in FIG. 18, the widths W3 of the third adjusting layer A3 are constant from the one end facet P of the integrated semiconductor optical device 1 to the joint boundary K. The widths W4 of the fourth adjusting layer A4 are constant from the other end facet Q of the integrated semiconductor optical device 1 to the joint boundary K.

At the butt-joint boundary K, the first adjusting layer A1 and the second adjusting layer A2 are butt-jointed together so as to correspond to each other; and the third adjusting layer A3 and the fourth adjusting layer A4 are butt-jointed together so as to correspond to each other. Thus, in the integrated semiconductor optical device according to the third embodiment, there is no necessity of providing a tapering region employed, for example, in Patent Document 1. As a result, the device length of the integrated semiconductor optical device according to the third embodiment can be made smaller than that of integrated semiconductor optical devices having tapering regions described in, for example, Patent Document 1. In summary, by using not only the first adjusting layer A1 but also the second adjusting layer A2, the third adjusting layer A3, and the fourth adjusting layer A4, the difference in the beam profile of guided light between the first semiconductor optical device S13 and the second semiconductor optical device S23 can be reduced. Thus, the degree of freedom in designing for reducing the difference in beam profile is enhanced.

The fifth portion 35 of the third adjusting layer A3 is in contact with the seventh portion 37 of the fourth adjusting layer A4 at the joint boundary K. The sixth portion 36 of the third adjusting layer A3 is in contact with the eighth portion 38 of the fourth adjusting layer A4 at the joint boundary K.

For example, the width (length in the X-axis direction) of the fifth portion 35 of the third adjusting layer A3 is the same as the width (length in the X-axis direction) of the sixth portion 36 of the third adjusting layer A3. In FIG. 17A, the widths of the fifth portion 35 and the sixth portion 36 of the third adjusting layer A3 are represented by W3. For example, the width (length in the X-axis direction) of the seventh portion 37 of the fourth adjusting layer A4 is the same as the width (length in the X-axis direction) of the eighth portion 38 of the fourth adjusting layer A4. In FIG. 17B, the widths of the seventh portion 37 and the eighth portion 38 of the fourth adjusting layer A4 are represented by W4.

As illustrated in FIG. 18, the total width W5 of the first portion 31 and the fifth portion 35 is different from the total width W6 of the third portion 33 and the seventh portion 37 at the joint boundary K. The layer constituted by the first portion 31 and the fifth portion 35 is joined to the layer constituted by the third portion 33 and the seventh portion 37 in a stepped configuration at the joint boundary K. The total width W5 of the second portion 32 and the sixth portion 36 is different from the total width W6 of the fourth portion 34 and the eighth portion 38 at the joint boundary K. The layer constituted by the second portion 32 and the sixth portion 36 is joined to the layer constituted by the fourth portion 34 and the eighth portion 38 in a stepped configuration at the joint boundary K.

By adjusting the total width W5 of the first portion 31 and the fifth portion 35, the total width W5 of the second portion 32 and the sixth portion 36, the total width W6 of the third portion 33 and the seventh portion 37, and the total width W6 of the fourth portion 34 and the eighth portion 38, the difference in the beam profile of guided light between the first semiconductor optical device S13 and the second semiconductor optical device S23 can be readily reduced.

In the example illustrated in FIG. 18, the total width W5 of the first portion 31 and the fifth portion 35 is larger than the total width W6 of the third portion 33 and the seventh portion 37.

A total width W5 of the first portion 31 and the fifth portion 35 and a total width W5 of the second portion 32 and the sixth portion 36 are constant from the one end facet P of the integrated semiconductor optical device 1 to the joint boundary K. A total width W6 of the third portion 33 and the seventh portion 37 and a total width W6 of the fourth portion 34 and the eighth portion 38 are constant from the other end facet Q of the integrated semiconductor optical device 1 to the joint boundary K.

By introducing the first adjusting layer A1, the second adjusting layer A2, the third adjusting layer A3, and the fourth adjusting layer A4 that have refractive indices and widths for adjusting the effective refractive indices and, if necessary, by also adjusting the width W01 of the first ridge portion 15 and the width W02 of the second ridge portion 25, the effective refractive indices of the first semiconductor optical device S13 and the second semiconductor optical device S23 can be substantially made equal to each other. For example, when the first adjusting layer A1 and the second adjusting layer A2 have the same refractive index and the third adjusting layer A3 and the fourth adjusting layer A4 have the same refractive index, the effective refractive indices may be adjusted in the following manner. When the effective refractive index of the first optical waveguide in the first semiconductor optical device is lower than the effective refractive index of the second optical waveguide in the second semiconductor optical device, in order to adjust these effective refractive indices, the total width W5 of the first portion 31 of the first adjusting layer A1 and the fifth portion 35 of the third adjusting layer A3 in the first semiconductor optical device S13 is made lager than the total width W6 of the third portion 33 of the second adjusting layer A2 and the seventh portion 37 of the fourth adjusting layer A4 in the second semiconductor optical device S23. Alternatively, when the effective refractive index of the first optical waveguide in the first semiconductor optical device is higher than the effective refractive index of the second optical waveguide in the second semiconductor optical device, in order to adjust these effective refractive indices, the total width W5 of the first portion 31 and the fifth portion 35 in the first semiconductor optical device S13 is made smaller than the total width W6 of the third portion 33 and the seventh portion 37 in the second semiconductor optical device S23.

The third adjusting layer A3 is formed of a material that is the same as or different from that of the fourth adjusting layer A4. A material for forming the first adjusting layer A1 or the second adjusting layer A2 may be used for forming the third adjusting layer A3 and the fourth adjusting layer A4. The third adjusting layer A3 and the fourth adjusting layer A4 may be formed of a semiconductor material that can be grown on an InP semiconductor substrate SB. For example, the third adjusting layer A3 and the fourth adjusting layer A4 are formed of a semiconductor material selected from InP, GaInAsP, GaInAs, AlGaInAs, and AlInAs.

Hereinafter, a method for forming the third adjusting layer A3 and the fourth adjusting layer A4 will be described. For example, the second adjusting layer A2 is formed as described in the second embodiment. Then, a semiconductor layer is further formed such that the first adjusting layer A1 of the first semiconductor optical device S13 and the second adjusting layer A2 of the second semiconductor optical device S23 are buried in the semiconductor layer. Subsequently, a mask (hereafter, referred to as a third adjusting layer mask) having a width larger than the total width of the first ridge portion 15 and the first adjusting layer A1 is formed in the first semiconductor optical device S13; and a mask (hereafter, referred to as a fourth adjusting layer mask) having a width larger than the total width of the second ridge portion 25 and the second adjusting layer A2 is formed in the second semiconductor optical device S23. That is, in the third embodiment, the third adjusting layer mask is formed so as to cover the contact layer 17 and the first adjusting layer A1; and the fourth adjusting layer mask is formed so as to cover the contact layer 27 and the second adjusting layer A2. Then, the semiconductor material is etched by using the third adjusting layer mask and the fourth adjusting layer mask to form the third adjusting layer A3 in the first semiconductor optical device S13 and the fourth adjusting layer A4 in the second semiconductor optical device S23. By appropriately changing the widths of the third adjusting layer mask and the fourth adjusting layer mask, the widths W3 of the third adjusting layer A3 and the widths W4 of the fourth adjusting layer A4 can be changed. After the formation of the third adjusting layer A3 and the fourth adjusting layer A4, the first and second buried layers 6, the upper electrode E2, and the lower electrode E1 are formed as in the integrated semiconductor optical device according to the first embodiment.

Although preferred embodiments according to the present invention have been described so far in detail, the present invention is not restricted to these embodiments. In the first embodiment, the example in which the first adjusting layer A1 is used in the first semiconductor optical device S1 and the second adjusting layer A2 is not used in the second semiconductor optical device S2 is described. Such an adjusting layer is used at least one of the first semiconductor optical device and the second semiconductor optical device. For example, the first adjusting layer A1 may be not used in the first semiconductor optical device and the second adjusting layer A2 may be used in the second semiconductor optical device. In the third embodiment, the first adjusting layer A1 and the third adjusting layer A3 are used in the first semiconductor optical device and the second adjusting layer A2 and the fourth adjusting layer A4 are used in the second semiconductor optical device. However, this configuration is not limitative and another configuration in which the first adjusting layer A1 and the third adjusting layer A3 are used in the first semiconductor optical device and the second adjusting layer A2 and the fourth adjusting layer A4 are not used in the second semiconductor optical device may be employed. Alternatively, still another configuration in which the first adjusting layer A1 and the third adjusting layer A3 are not used in the first semiconductor optical device and the second adjusting layer A2 and the fourth adjusting layer A4 are used in the second semiconductor optical device may be employed. When any one of these configurations is employed, an integrated semiconductor optical device in which good optical coupling can be achieved between the first semiconductor optical device and the second semiconductor optical device can be provided.

In the above-described embodiments, the examples in which the adjusting layers are formed of semiconductor materials are described. However, materials for forming such adjusting layers are not restricted to semiconductor materials. For example, the adjusting layers (first adjusting layer A1, second adjusting layer A2, third adjusting layer A3, and fourth adjusting layer A4) may be formed of a dielectric material. For example, the dielectric material is any one of titanium oxide ($TiO_2$), tantalum oxide ($Ta_2O_5$), and zirconium oxide ($ZrO_2$). These dielectric materials have a refractive index in the neighborhood of 2.2. An adjusting layer formed of such a dielectric material has a refractive index between the refractive index of semiconductor materials forming the core region R (first core layer 10 and second core layer 20) and the refractive index of an insulating material forming the first and second buried layers 6. In general, the refractive index of semiconductor materials forming the core region R is 3 or more and the refractive index of an insulating material forming the first and second buried layers 6 is about 1.5.

Accordingly, by using an adjusting layer formed of a dielectric material, the optical confinement of guided light in a direction (hereafter, also referred to as a first direction) that is orthogonal to a direction in which the first cladding layer, the core region, and the second cladding layer are stacked and the direction of the predetermined axis is reduced. As a result, the beam profile of guided light in the first semiconductor optical device is broadened in the first direction. In contrast, the beam profile of guided light in the first semiconductor optical device in a direction (hereafter, also referred to as a second direction) that is orthogonal to the direction of the predetermined axis and parallel to the direction in which the first cladding layer, the core region, and the second cladding layer are stacked is conversely narrowed due to the broadened profile in the first direction.

Thus, the beam profile in the first semiconductor optical device is made close to the beam profile in the second semiconductor optical device. Accordingly, the difference between the beam profile of guided light in the first semiconductor optical device and the beam profile of guided light in the second semiconductor optical device can be reduced and hence scattering or reflection of guided light at the butt-joint joint interface between the first semiconductor optical device and the second semiconductor optical device can be reduced. Thus, coupling loss of guided light can be suppressed without a tapering region.

A film of such a dielectric material can be formed by a chemical vapor deposition (CVD) method or a sputtering method, at a low temperature of, for example, 200° C. or less. Accordingly, the probability of thermally damaging the first ridge portion 15 and the second ridge portion 25 that are next to adjusting layers is low. When a semiconductor material is used for forming an adjusting layer, the adjusting layer is doped with an impurity as described above to increase the resistance of the adjusting layer. Such an impurity and a dopant in a cladding layer tend to interdiffuse. Such an interdiffusion may result in, for example, a decrease in the resistance of the adjusting layer and an increase in leakage current. Thus, device characteristics may be degraded. In contrast, such a dielectric material is inherently insulative and has a high resistance without being doped with an impurity. Accordingly, use of such a dielectric material for forming an adjusting layer is preferable because such a device degradation caused by the interdiffusion can be avoided.

The adjusting layers (first adjusting layer A1, second adjusting layer A2, third adjusting layer A3, and fourth adjusting layer A4) may be formed of amorphous silicon (a-Si). A film formed of a-Si can be made to have a refractive index of 2 to 3 by appropriately controlling the process conditions such as the film-formation rate or the film-formation temperature.

In the above-described embodiments, the first and second buried layers 6 are formed of the same material both in the first semiconductor optical device and the second semiconductor optical device. However, these examples are not limitative. If necessary, the first region 91 of the first buried layer 6 in the first semiconductor optical device and the second region 92 of the second buried layer 6 in the second semiconductor optical device may be formed of different materials.

In the above-described embodiments, the examples in which the first semiconductor optical device is a distributed feedback laser diode and the second semiconductor optical device is an electro-absorption optical modulator are described. However, the present invention is not restricted to these examples and the present invention is also applicable to various semiconductor devices integrated by butt joint. For example, the present invention is applicable to a semiconductor device in which the first semiconductor optical device is a laser diode (LD) and the second semiconductor optical device is a Mach-Zehnder modulator; or a semiconductor device in which the first semiconductor optical device is a LD and the second semiconductor optical device is a device other than a modulator, such as a light-receiving device, a semiconductor optical amplifier (SOA), or an optical multiplexer and demultiplexer. The number of semiconductor optical devices joined together by butt joint is not restricted to two. A structure according to the present invention is also applicable to devices in which three or more devices are integrated together by butt joint, such as wavelength tunable LDs or optical matrix switches.

Principles of the present invention have been described so far in the preferred embodiments with reference to the drawings. However, those skilled in the art understand that the embodiments can be modified without departing from the principles. Therefore, all the variations and modifications within the scope and spirit of the Claims are claimed as the present invention.

What is claimed is:

1. An integrated semiconductor optical device comprising:
   a semiconductor substrate;
   a first end facet and second end facet opposite to the first end facet;
   a first semiconductor optical device including a first lower cladding layer provided on the semiconductor substrate, a first upper cladding layer including a first ridge portion, a first core layer provided between the first lower cladding layer and the first upper cladding layer, a first buried layer surrounding the first ridge portion, and a first adjusting layer provided between the first buried layer and the first ridge portion; and
   a second semiconductor optical device including a second lower cladding layer provided on the semiconductor substrate, a second upper cladding layer including a second ridge portion, and a second core layer provided between the second lower cladding layer and the second upper cladding layer, wherein
   the first buried layer contains an insulating material,
   the first semiconductor optical device and the second semiconductor optical device are arranged next to each other in a predetermined direction,
   the first core layer is joined to the second core layer by a butt joint method at a joint boundary between the first semiconductor optical device and the second semiconductor optical device,
   the first adjusting layer has a refractive index lower than a refractive index of the first core layer and higher than a refractive index of the first buried layer,
   the first adjusting layer extends in the predetermined direction, and
   the first adjusting layer has a constant width from the first end facet to the joint boundary.

2. The integrated semiconductor optical device according to claim 1, wherein the first ridge portion has a width different from a width of the second ridge portion.

3. The integrated semiconductor optical device according to claim 1, wherein the first adjusting layer is in contact with the first ridge portion.

4. The integrated semiconductor optical device according to claim 1, wherein the first upper cladding layer, the first core layer, the second upper cladding layer, and the second core layer contain semiconductor materials.

5. The integrated semiconductor optical device according to claim 1, wherein
   the first semiconductor optical device includes a first optical waveguide including the first lower cladding layer, the first core layer, and the first upper cladding layer,
   the second semiconductor optical device includes a second optical waveguide including the second lower cladding layer, the second core layer, and the second upper cladding layer, and
   an effective refractive index of the first optical waveguide is substantially equal to an effective refractive index of the second optical waveguide.

6. The integrated semiconductor optical device according to claim 1, wherein the first adjusting layer contains a material selected from titanium oxide, tantalum oxide, zirconium oxide, and amorphous silicon.

7. The integrated semiconductor optical device according to claim 1, wherein the first adjusting layer contains a semiconductor material selected from InP, GaInAsP, GaInAs, AlGaInAs, and AlInAs.

8. The integrated semiconductor optical device according to claim 1, wherein the insulating material is a polyimide resin or a benzocyclobutene resin.

9. The integrated semiconductor optical device according to claim 1, wherein
the second semiconductor optical device further includes a second buried layer surrounding the second ridge portion, and a second adjusting layer provided between the second buried layer and the second ridge portion,
the second adjusting layer extends in the predetermined direction, and
the second adjusting layer has a refractive index lower than a refractive index of the second core layer and higher than the refractive index of the second buried layer.

10. The integrated semiconductor optical device according to claim 9, wherein the second adjusting layer has a constant width from the second end facet to the joint boundary.

11. The integrated semiconductor optical device according to claim 9, wherein
the second adjusting layer is in contact with the second ridge portion.

12. The integrated semiconductor optical device according to claim 1, wherein
the first semiconductor optical device further includes a third adjusting layer sandwiched between the first adjusting layer and the first buried layer, and
the third adjusting layer has a refractive index lower than the refractive index of the first adjusting layer and higher than the refractive index of the first buried layer.

13. The integrated semiconductor optical device according to claim 12, wherein the third adjusting layer has a constant width from the first end facet to the joint boundary.

14. The integrated semiconductor optical device according to claim 12, wherein
the second semiconductor optical device further includes a second buried layer surrounding the second ridge portion, a second adjusting layer provided between the second buried layer and the second ridge portion, and a fourth adjusting layer provided between the second adjusting layer and the second buried layer,
the second adjusting layer extends in the predetermined direction,
the second adjusting layer is in contact with the second ridge portion,
the second adjusting layer has a refractive index lower than a refractive index of the second core layer and higher than the refractive index of the second buried layer, and
the fourth adjusting layer has a refractive index lower than the refractive index of the second adjusting layer and higher than the refractive index of the second buried layer.

15. The integrated semiconductor optical device according to claim 14, wherein the second adjusting layer and the fourth adjusting layer have constant widths from the second end facet to the joint boundary.

16. The integrated semiconductor optical device according to claim 1, wherein
the second semiconductor optical device further includes a second buried layer surrounding the second ridge portion, a second adjusting layer provided between the second buried layer and the second ridge portion, and a fourth adjusting layer provided between the second adjusting layer and the second buried layer,
the second adjusting layer extends in the predetermined direction,
the second adjusting layer is in contact with the second ridge portion,
the second adjusting layer has a refractive index lower than a refractive index of the second core layer and higher than the refractive index of the second buried layer, and
the fourth adjusting layer has a refractive index lower than the refractive index of the second adjusting layer and higher than the refractive index of the second buried layer.

17. The integrated semiconductor optical device according to claim 16, wherein the second adjusting layer and the fourth adjusting layer have constant widths from the second end facet to the joint boundary.

18. The integrated semiconductor optical device according to claim 1, wherein
the first semiconductor optical device is a light emitting device, and
the second semiconductor optical device is an electro-absorption optical modulator.

19. An integrated semiconductor optical device comprising:
a semiconductor substrate;
a first end facet and a second end facet opposite to the first end facet;
a first semiconductor optical device including a first lower cladding layer provided on the semiconductor substrate, a first upper cladding layer including a first ridge portion, a first core layer provided between the first lower cladding layer and the first upper cladding layer, a first buried layer surrounding the first ridge portion, and a first adjusting layer provided between the first buried layer and the first ridge portion; and
a second semiconductor optical device including a second lower cladding layer provided on the semiconductor substrate, a second upper cladding layer including a second ridge portion, and a second core layer provided between the second lower cladding layer and the second upper cladding layer wherein
the first ridge portion has a width different from a width of the second ridge portion,
the first semiconductor optical device and the second semiconductor optical device are arranged next to each other in a predetermined direction,
the first core layer is joined to the second core layer by a butt joint method at a joint boundary between the first semiconductor optical device and the second semiconductor optical device,
the first adjusting layer has a refractive index lower than a refractive index of the first core layer and higher than a refractive index of the first buried layer, and
the first adjusting layer extends in the predetermined direction.

* * * * *